(12) United States Patent
Liaw

(10) Patent No.: US 10,734,478 B2
(45) Date of Patent: Aug. 4, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Jhon-Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/925,630

(22) Filed: Mar. 19, 2018

(65) Prior Publication Data

US 2019/0288069 A1 Sep. 19, 2019

(51) Int. Cl.
| H01L 29/08 | (2006.01) |
| H01L 21/8234 | (2006.01) |
| H01L 27/11 | (2006.01) |
| H01L 29/417 | (2006.01) |
| H01L 27/088 | (2006.01) |

(52) U.S. Cl.
CPC .. H01L 29/0886 (2013.01); H01L 21/823431 (2013.01); H01L 21/823437 (2013.01); H01L 27/0886 (2013.01); H01L 27/1104 (2013.01); H01L 29/41791 (2013.01)

(58) Field of Classification Search
None
See application file for complete search history.

(56) References Cited

U.S. PATENT DOCUMENTS

| 9,287,402 | B2* | 3/2016 | Oh | H01L 29/66477 |
| 9,443,935 | B2* | 9/2016 | Oh | H01L 29/66477 |
| 10,038,093 | B2* | 7/2018 | Sung | H01L 29/7843 |
| 10,515,967 | B2* | 12/2019 | Liaw | H01L 21/823892 |
| 2013/0292777 | A1* | 11/2013 | Liaw | G11C 11/412 257/369 |
| 2016/0155804 | A1* | 6/2016 | Oh | H01L 29/66477 257/369 |
| 2016/0315085 | A1* | 10/2016 | Choi | H01L 27/0924 |
| 2017/0062613 | A1* | 3/2017 | Sung | H01L 29/7843 |
| 2017/0358680 | A1* | 12/2017 | Jeong | H01L 21/28158 |
| 2018/0331220 | A1* | 11/2018 | Sung | H01L 29/7843 |
| 2018/0366583 | A1* | 12/2018 | Kim | H01L 29/7848 |
| 2019/0164971 | A1* | 5/2019 | Liaw | H01L 27/0924 |
| 2019/0326284 | A1* | 10/2019 | Kim | H01L 29/66545 |

* cited by examiner

*Primary Examiner* — Telly D Green
(74) *Attorney, Agent, or Firm* — Maschoff Brennan

(57) ABSTRACT

A semiconductor device includes a substrate, a first circuit, and a second circuit. The first circuit is disposed on the substrate and includes a first semiconductor fin and a first gate electrode straddling the first semiconductor fin. The second circuit is different from the first circuit and disposed on the substrate. The second circuit includes a second semiconductor fin and a second gate electrode straddling the second semiconductor fin. A width of the first semiconductor fin is different from a width of the second semiconductor fin.

20 Claims, 16 Drawing Sheets

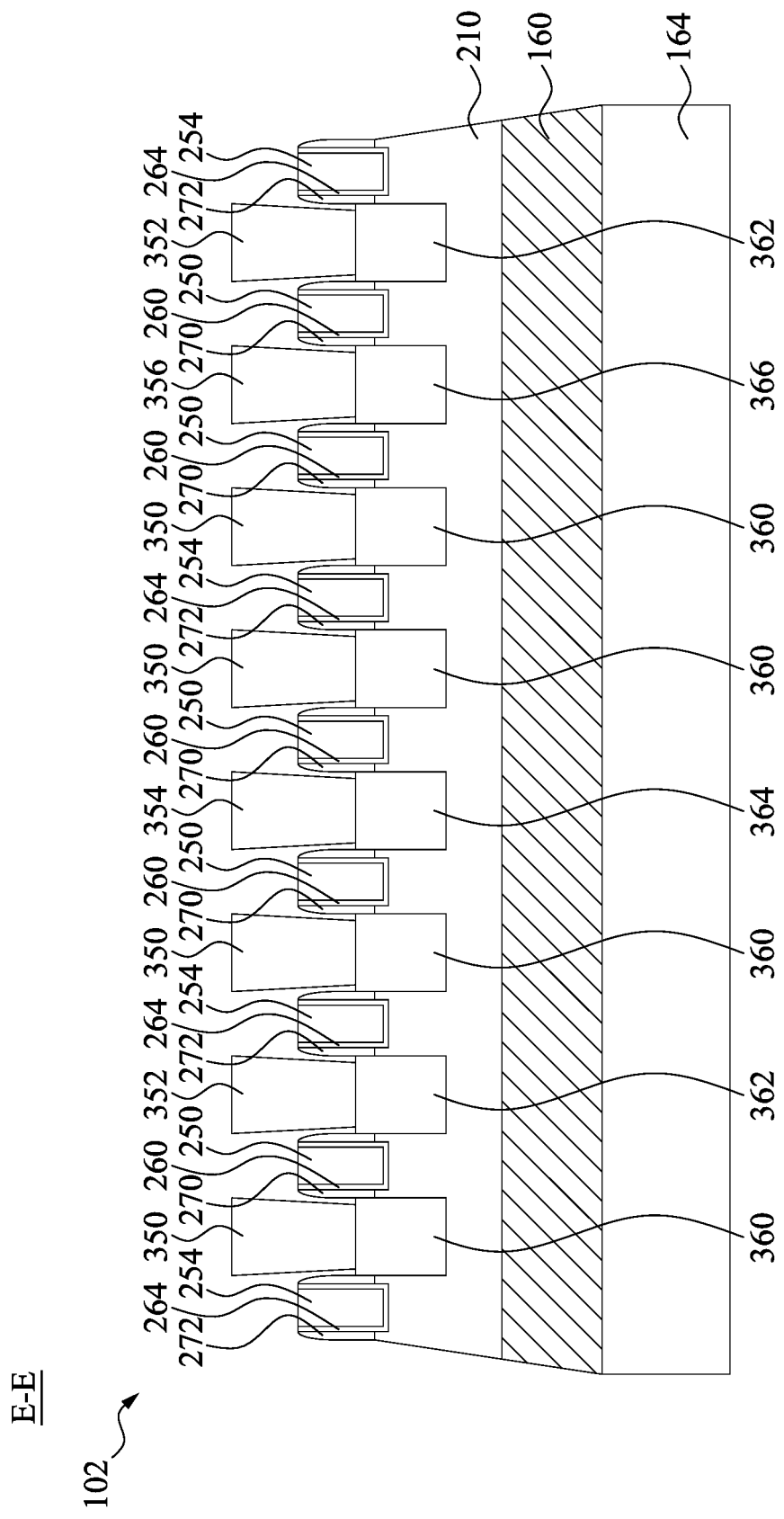

C'-C'

D'-D'

SEMICONDUCTOR DEVICE AND MANUFACTURING METHOD THEREOF

BACKGROUND

The semiconductor integrated circuit (IC) industry has produced a wide variety of digital devices to address issues in a number of different areas. Some of these digital devices are electrically coupled to static random access memory (SRAM) devices for the storage of digital data. In some applications in an IC chip, a plurality of SRAM devices are implemented based on different design criteria. For example, at least one SRAM device of the plurality of SRAM devices is designed to have faster data access than all other SRAM device(s) of the plurality of SRAM devices; and at least one SRAM device of the plurality of SRAM devices is designed to occupy less area per stored bit than all other SRAM device(s) of the plurality of SRAM devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A-4F are cross-sectional views along line A-A, line B-B, line C-C, line D-D, line E-E, and line F-F in FIG. 3B respectively.

DETAILED DESCRIPTION

Figure 1A:
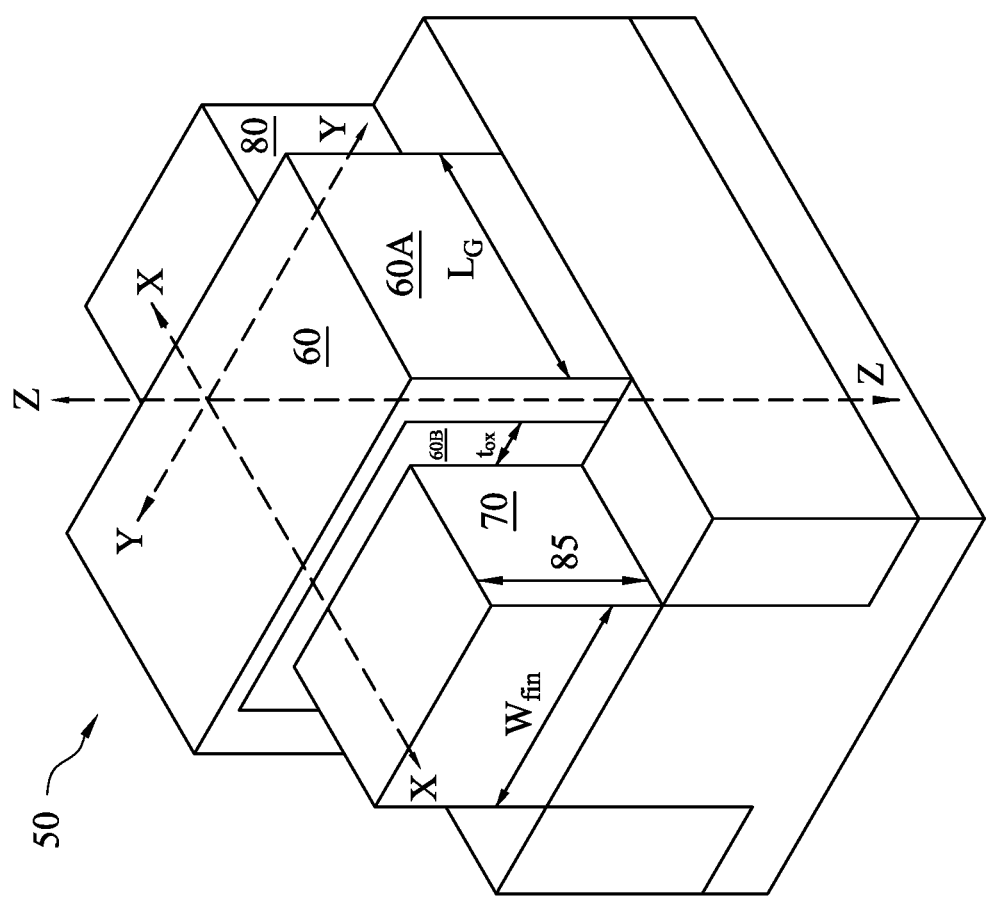
FIG. 1A is a perspective view of an example FinFET device.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

FIG. 1A is a perspective view of an example FinFET device. The use of FinFET devices has been gaining popularity in the semiconductor industry. Referring to FIG. 1A, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1A. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

Figure 1B:
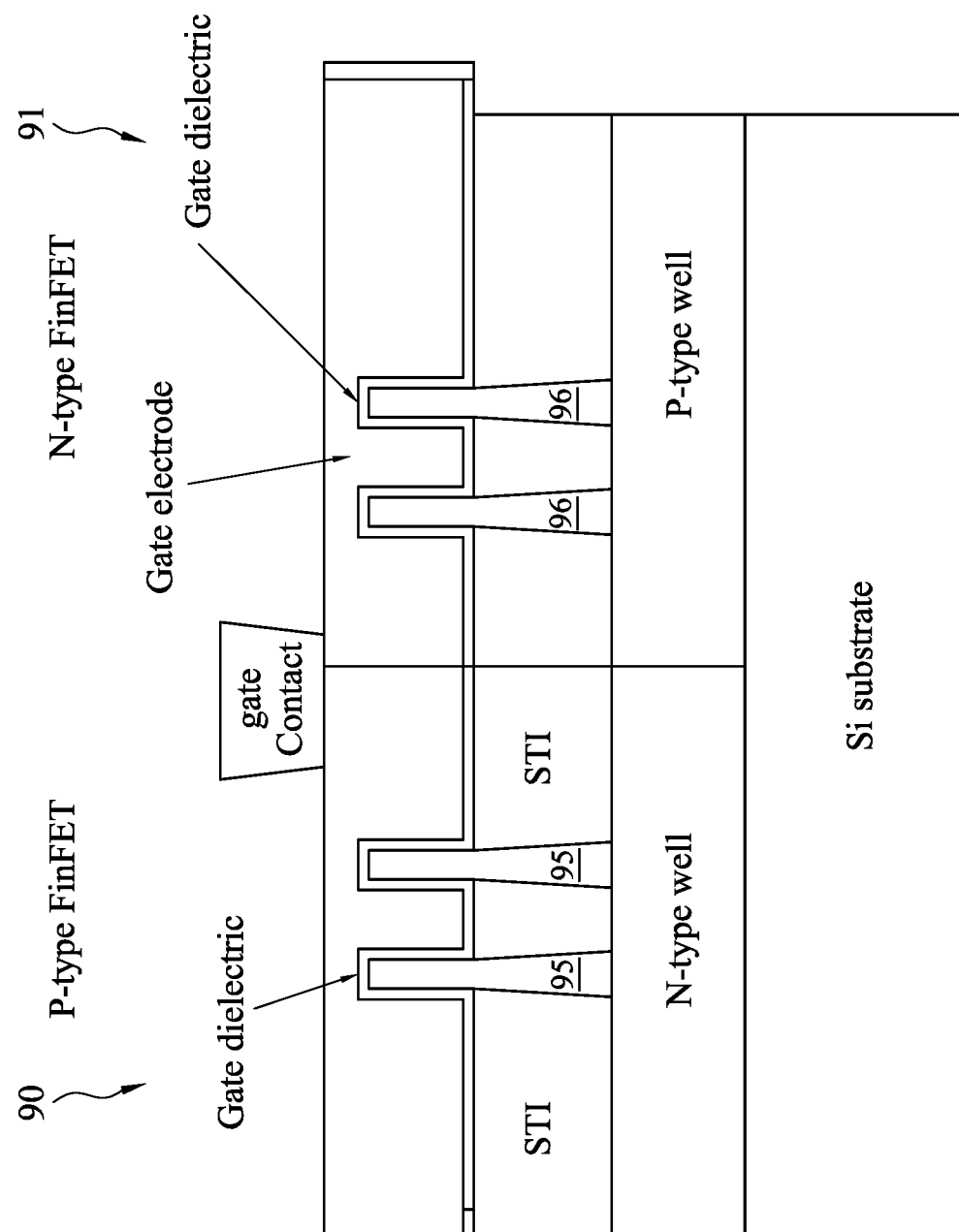
FIG. 1B is a diagrammatic cross-sectional side view of FinFET transistors in a CMOS configuration.

FIG. 1B illustrates a diagrammatic cross-sectional side view of FinFET transistors in a CMOS configuration. The CMOS FinFET includes a substrate, for example a silicon substrate. An N-type well and a P-type well are formed in the substrate. A dielectric isolation structure such as a shallow trench isolation (STI) is formed over the N-type well and the P-type well. A P-type FinFET 90 is formed over the N-type well, and an N-type FinFET 91 is formed over the P-type well. The P-type FinFET 90 includes fins 95 that protrude upwardly out of the STI, and the N-type FinFET 91 includes fins 96 that protrude upwardly out of the STI. The fins 95 include the channel regions of the P-type FinFET 90, and the fins 96 include the channel regions of the N-type FinFET 91.

In some embodiments, the fins 95 are comprised of silicon germanium, and the fins 96 are comprised of silicon. A gate dielectric is formed over the fins 95-96 and over the STI, and a gate electrode is formed over the gate dielectric. In some embodiments, the gate dielectric includes a high-k dielectric material, and the gate electrode includes a metal gate electrode, such as aluminum and/or other refractory metals. In some other embodiments, the gate dielectric may include SiON, and the gate electrode may include polysilicon. A gate contact is formed on the gate electrode to provide electrical connectivity to the gate.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET fabrication methods may still have shortcomings, such as lack of optimization for embedded SRAM manufacturing. For example, traditional FinFET fabrication may face concerns related to SRAM cell write margin and logic circuit speeds. The present disclosure describe FinFET logic circuit and SRAM cells that have improved SRAM cell write margin without reducing the logic circuit speeds, as discussed in more detail below.

Figure 2:
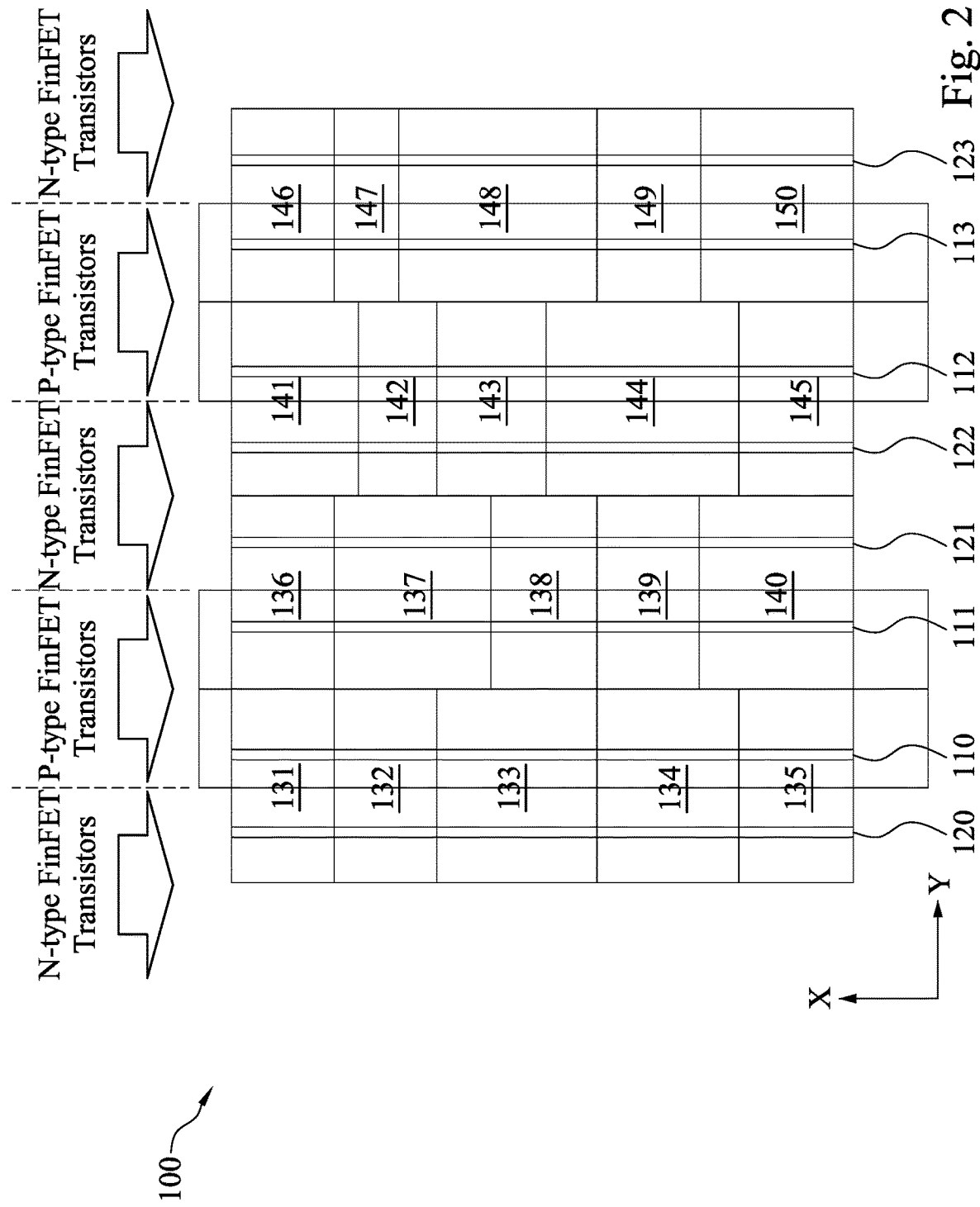
FIG. 2 is a top view of a standard (STD) cells array according to embodiments of the present disclosure.

FIG. 2 illustrates a top view of a standard (STD) cells array according to embodiments of the present disclosure. The standard cells array 100 may include logic circuits or logic devices, and as such it is also referred to as a logic cells array or a logic circuit array. In various embodiments, the logic circuits or devices may include components such as inverters, NAND gates, NOR gates, flip-flops, or combinations thereof.

As illustrated in FIG. 2, the standard cells array 100 includes N-type FinFET transistors with a P-type well, as well as P-type FinFET transistors with an N-type well. The standard cells array 100 also includes a plurality of elongated fin lines, for example fin lines 110-111 as parts of the P-type FinFET transistors, as well as fin lines 120-121 as parts of the N-type FinFET transistors. The P-type FinFET fin lines 110-111 are located over the N-type wells, whereas the N-type FinFET fin lines 120-121 are located over the P-type wells.

As an example, the standard cells array 100 shown herein includes 10 standard cells 131 through 140, where the cells 131 through 135 are arranged into a first column, and the cells 136 through 140 are arranged into a second column adjacent to the first column. Of course, FIG. 2 merely illustrates an example of the standard cells array 100, and other embodiments may have different numbers of cells and/or may be arranged differently.

As shown in FIG. 2, the fin lines 110 to 113 and 120 to 123 each extend through a respective column of the standard cells (e.g., fin lines 110 and 120 extending through the standard cells 131 to 135, fin lines 111 and 121 extending through the standard cells 136 to 140, fin lines 122 and 112 extending through the standard cells 141 to 145, and fin lines 113 and 123 extending through the standard cells 146 to 150) in the X-direction (X-direction of FIG. 1A). Thus, the fin lines 110 to 113 and 120 to 123 may each be considered "continuous."

As discussed above with reference to FIG. 1A, the fin lines 110 to 113 and 120 to 123 each include a channel region as well as source/drain regions located next to (e.g., on opposite sides of) the channel region. The FinFET transistors of the STD cells array 100 each include a respective gate electrode that wraps around a respective one of the fin lines 110 to 113 or 120 to 123 in the manner described above with reference to FIG. 1A. In the present embodiments, the P-type FinFET (PMOSFET) fin lines 110 to 113 are comprised of a silicon germanium (SiGe) material (for enhancing the strain effect), but the N-type FinFET (NMOSFET) fin lines 120 to 123 are comprised of a non-germanium-containing semiconductor material, for example silicon (Si). Therefore, in some embodiments, the PMOSFET has a SiGe channel, but the NMOSFET has a Si channel. In some embodiments, a channel fin width of the NMOSFET is narrower than a channel fin width of the PMOSFET. In some embodiments, the source/drain regions of the NMOSFET includes an epi-material selected from the group consisting of: SiP, SiC, SiPC, SiAs, Si, or combinations thereof. In some embodiments, the PMOSFET's source/drain region has a wider width than the channel region.

In some embodiments, for the PMOSFET, the germanium atomic concentration in the SiGe channel region is less than the germanium atomic concentration in the source/drain region. For example, the germanium atomic concentration in the SiGe channel region may be in a range between about 10% and about 40%, and the germanium atomic concentration in the source/drain region may be in a range between about 30% and about 75% in some embodiments.

In some embodiments, for the PMOSFET, the SiGe channel fin width is smaller than the SiGe channel sidewall depth. For example, the SiGe channel fin width for the PMOSFET may be in a range between about 3 nanometers (nm) and about 10 nm, and the SiGe channel sidewall depth (labeled in FIG. 1A as channel sidewall depth 85) may be in a range between about 30 nm and about 90 nm in some embodiments.

As discussed above, each of the fin lines 110 to 113 and 120 to 123 of the standard cells array 100 is continuous. For example, the fin lines 110 to 113 and 120 to 123 each extend across at least three abutted cells (e.g., cells abutted in the X-direction). In the embodiment shown in FIG. 2, the fin lines 110 and 120 each extend across five abutted standard cells 131 to 135, the fin lines 111 and 121 each extend across five other abutted standard cells 136 to 140, the fin lines 112 and 122 each extend across five other abutted standard cells 141 to 145, and the fin lines 113 and 123 each extend across five other abutted standard cells 146 to 150.

Figure 3A:
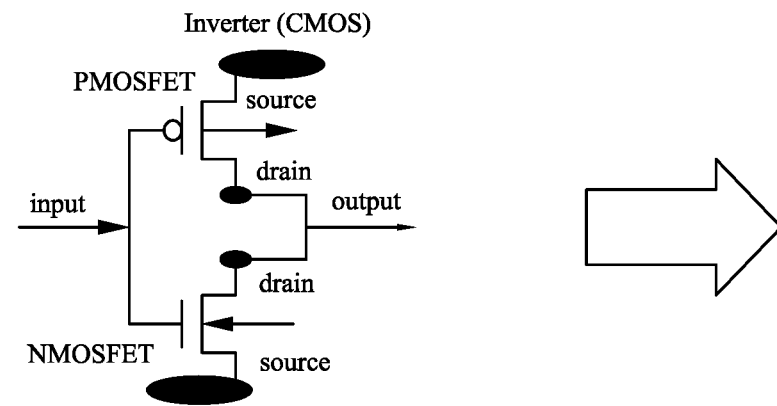
FIG. 3A is circuit schematics of various logic gates according to some embodiments of the present disclosure.
Figure 3A:
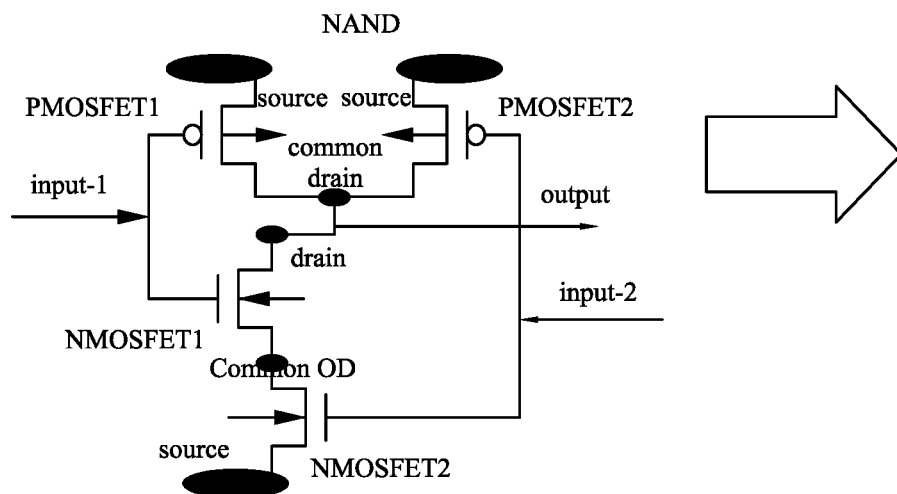
Figure 3A:
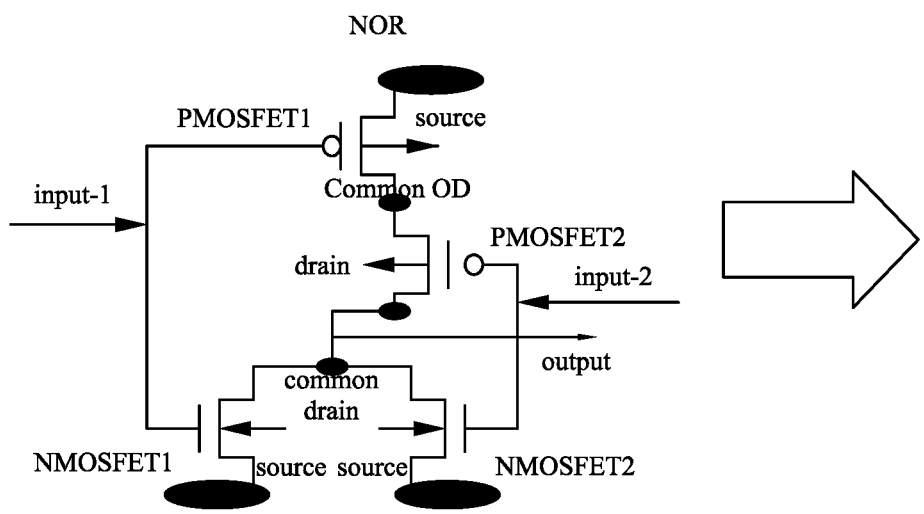
Figure 3B:
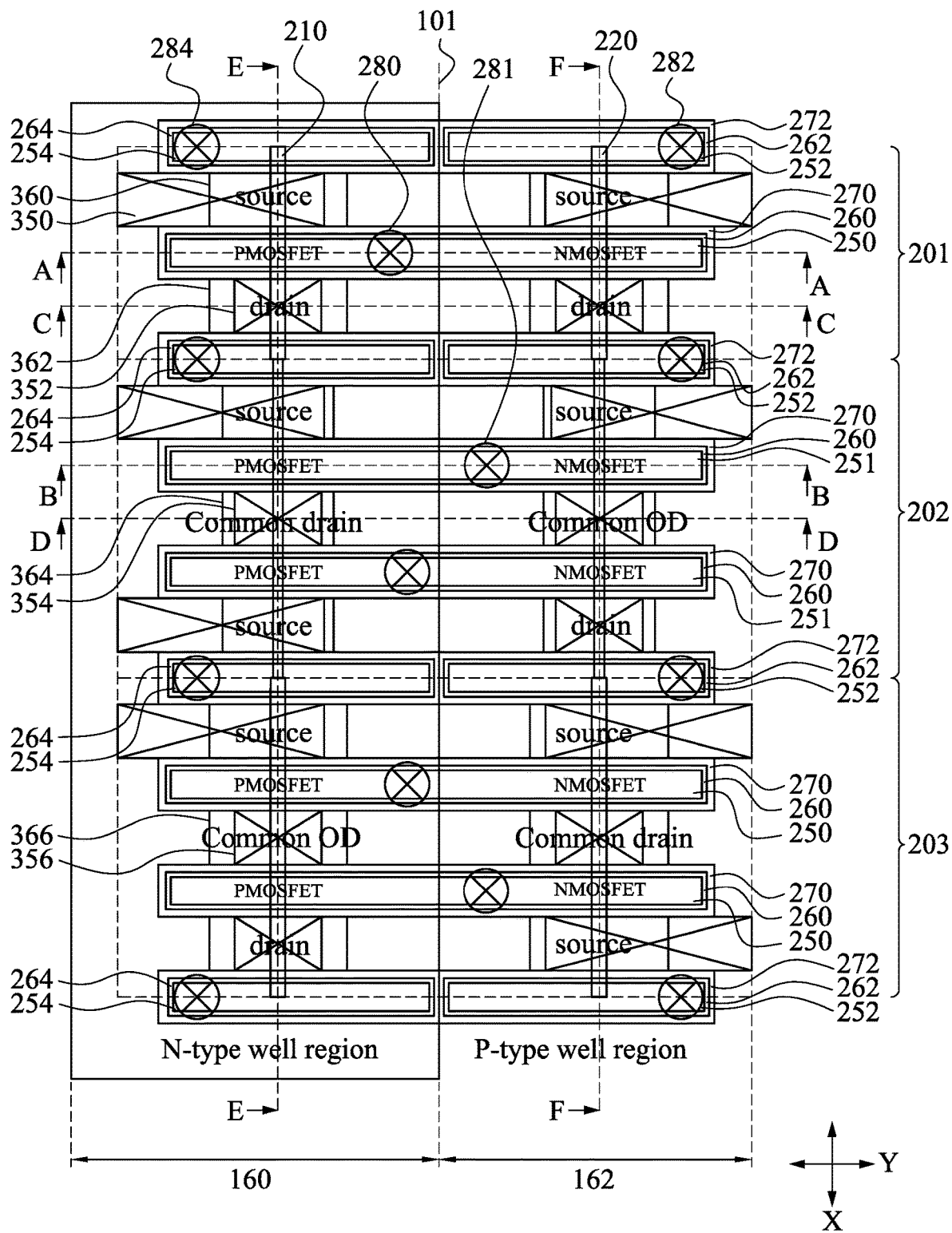
FIG. 3B is the top view of a layout corresponding to the logic gates shown in FIG. 3A according to some embodiments of the present disclosure.

FIGS. 3A and 3B illustrate one or more standard cells according to some embodiments of the present disclosure. In more detail, FIG. 3A illustrates the circuit schematics of some common logic gates built using CMOS FinFETs; and FIG. 3B illustrates the top view layout corresponding to these logic gates shown in FIG. 3A. It is understood that the top view layout shown in FIG. 3B may correspond to one or more of the STD cells (or portions thereof) shown in FIG. 2.

The layout includes a first circuit 201, a second circuit 202, and a third circuit 203. At least two of the first circuit 201, the second circuit 202, and the third circuit 203 are different type of circuits form each other. In some embodiments, the first circuit 201 can be an inverter, the second circuit 202 can be a NAND, and the third circuit 203 can be a NOR. As examples, the logic gates shown in FIG. 3A includes an inverter gate, a NAND gate, and a NOR gate. The inverter gate, the NAND gate, and the NOR gate each include one or more N-type MOSFETs (NMOSFET) and one or more P-type MOSFETs (PMOSFETs). The particular type of logic gate is determined by coupling the gate, source, and drain of the NMOSFETs and PMOSFETs in a specific configuration as shown in FIGS. 3A and 3B. The input terminal and output terminal of each logic gate is also labeled in FIG. 3A as such.

The top view layout of FIG. 3B illustrates PMOSFETs with an N-type well region 160 and NMOSFETs with a P-type well region 162. The N-type well region 160 and the P-type well region 162 are on opposite side of an imaginary line 101 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 1, the N-type well region 160 is a region for forming p-channel metal-oxide semiconductor (PMOS) transistors, and the P-type well region 162 is a region for forming n-channel metal-oxide semiconductor (NMOS) transistors. The described conductivity of the well regions 160 and 162 herein is an example. Other arrangements are within the scope of various embodiments.

A plurality of elongated fin lines 210 and 220 (may also refer to as semiconductor fins in the manufacturing base on the fin lines shown in the layout) extend in an elongated manner in the X-direction. The fin line 210 is part of the PMOSFET, and the fin line 220 is part of the NMOSFET. The PMOSFET fin line 210 is located over the N-type well region 160, whereas the NMOSFET fin line 220 is located over the P-type well region 162. In some embodiments, the fin lines 210 and 220 are also referred to as oxide-definition (OD) regions. Example materials of the fin lines 210 and 220 include, but are not limited to, semiconductor materials doped with various types of p-dopants and/or n-dopants. In some embodiments, the fin lines 210 and 220 include dopants of the same type. In some embodiments, one of the fin lines 210 and 220 includes dopants of a type different from a type of dopants of another one of the fin lines 210 and 220. The fin lines 210 and 220 are isolated from each other by one or more isolation structures as described herein. The fin lines 210 and 220 are within corresponding well regions.

As discussed above with reference to FIG. 1A, the fin lines 210 and 220 each include a channel region as well as source/drain regions located next to (e.g., on opposite sides of) the channel region. In the present embodiments, the PMOSFET fin line 210 is comprised of a silicon germanium (SiGe) material (for strain effect enhancement), but the NMOSFET fin line 220 is comprised of a non-germanium-containing semiconductor material, for example Si. The fin lines 210 and 220 are each continuous, for example they each extend across three or more abutted cells (abutted in the X-direction).

As shown in FIG. 3B, a length of the fin line 210 is substantially equal to a length of the fin line 220. In some embodiments, a width of at least one of the fin lines 210 and 220 are not uniform. In some embodiment, the fin line 210 and/or the fin line 220 has the width in a cell (may also refer to as a first circuit or a first device) that is different from that in another cell (may also refer to as a second circuit or a second device). In FIG. 3B, the width of the fin line 210 in the NAND is different from that in the inverter and/or different from that in the NOR. Alternatively, the width of the fin line 220 in the NAND is different from that in the inverter and/or different from that in the NOR. Specifically, the width of the fin line 210 under a second gate electrode 251 and in the NAND is different from that under a first gate electrode 250 in the inverter and/or different from that in the NOR, and the width of the fin line 220 under the second gate electrode 251 and in the NAND and is different from that under a first gate electrode 250 in the inverter and/or different from that in the NOR. Therefore, the FinFET devices have a multiple threshold voltage (Vt) in the inverter, NAND, and/or NOR to serve for high speed and low standby power application simultaneously.

A plurality of gate electrodes 250, 251, 252, and 254 extend along the Y-direction, across the fin lines 210 and 220. Example materials of the gate electrodes 250, 251, 252, and 254 include, but are not limited to, polysilicon and metal. Other materials are within the scope of various embodiments. The gate electrodes 250, 251, 252, and 254 and the fin lines 210 and 220 form one or more transistors. One or more of the gate electrodes 250, 251, 252, and 254 are coupled to other circuitry of the semiconductor device by corresponding gate contacts.

Specifically, in each of the circuit cells (e.g., the inverter, NAND, or NOR), one or more CMOS gate electrodes 250 and 251 extend into both the N-type well region 160 and the P-type well region 162 in the Y-direction. The portion of gate electrodes 250 and 251 located over the N-type well region 160 forms the gate of the PMOSFET, and the portion of the gate electrodes 250 and 251 located over the P-type well region 162 forms the gate of the NMOSFET. Each of the gate electrodes 250 and 251 wraps around the fin lines 210 and 220 in the manner described above with reference to FIG. 1A. For example, the gate electrodes 250 and 251 in the PMOSFET wrap around the fin lines 210, and the gate electrodes 250 and 251 in the NMOSFET wrap around the fin line 220. The source/drain contacts (providing electrical connectivity to the source/drains of the FinFETs) are also illustrated in the top view layout of FIG. 3B, some examples of which are labeled herein as source contacts 350 and drain contacts 352. It is understood that silicide layers may be formed on the source/drain regions, and the source/drain contacts may be formed on the silicide layers.

According to the various aspects of the present disclosure, a plurality of isolation transistors is implemented between adjacent cells to provide electrical isolation between the adjacent circuit cells. In more detail, PMOSFET isolation transistors include gate electrodes 254, and the NMOSFET isolation transistors include gate electrodes 252. The gate electrodes 254 and 252 are each located on a border between two adjacent circuit cells, for example on the border between the inverter cell and the NAND cell, on the border between the NAND cell and the NOR cell, etc. The gate electrodes 254 of the PMOSFET isolation transistors are each tied to a voltage source Vdd, and the gate electrodes 252 of the NMOSFET isolation transistors are each tied to a voltage source Vss.

For the PMOSFET isolation transistors, their gate electrodes 254 around the fin line 210 having the SiGe channels. The source region of the PMOSFET isolation transistor is common with the P-type source/drain region of one of the PMOSFET transistors from the standard cells, and the drain region of the PMOSFET isolation transistor is common with the P-type source/drain region of another one of the PMOSFET transistors from the standard cells. Likewise, for the NMOSFET isolation transistors, their gate electrodes 252 wrap around the fin lines 220 having the Si channels. The source region of the NMOSFET isolation transistor is common with the N-type source/drain region of one of the NMOSFET transistors from the standard cells, and the drain region of the NMOSFET isolation transistor is common with the N-type source/drain region of another one of the NMOSFET transistors from the standard cells.

Due at least in part to their locations (e.g., the gate electrodes 254 being located on the circuit cell borders) and their electrical configuration (e.g., the gate electrodes 254 being electrically tied to Vdd), the PMOSFET isolation transistors provide electrical isolation between the adjacent circuit cells for the PMOSFET, for example between the inverter cell and the NAND cell, or between the NAND cell and the NOR cell. Similarly, the NMOSFET isolation transistors provide electrical isolation between the adjacent circuit cells for the NMOSFET, for example between the inverter cell and the NAND cell, or between the NAND cell and the NOR cell.

In some embodiments, to electrically isolate the gate electrodes 250, 251, 252, and 254 from the fin lines 210 and 220, gate dielectric layers 260, 262, and 264 are arranged under and around the corresponding gate electrodes 250, 251, 252, and 254. Example materials of the gate dielectric layers 260, 262, and 264 include, but are not limited to, silicon nitride, silicon oxynitride, metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide. In some embodiments, the gate dielectric layers 260, 262, and 264 include multi-layer structure.

In some embodiments, gate spacers 270 and 272 are at least arranged along sides of the corresponding plurality of gate electrodes 250, 251, 252, and 254. For example, the gate spacers 270 is arranged along longitudinal sides of the gate electrodes 250 and 251 in the Y-direction, and the gate spacer 272 is arranged along longitudinal sides of the gate electrodes 252 and 254. The gate spacers 270 and 272 include one or more dielectric materials for electrically isolating the corresponding gate electrodes 250, 251, 252, and 254 from unintended electrical contact. Example dielectric materials of the gate spacers 270 and 272 include, but are not limited to, silicon nitride, oxynitride and silicon carbide. In some embodiments, one or more of the gate spacers 270 and 272 have a tapered profile as described herein as shown in FIGS. 4E and 4F.

The gate contacts 280, 281, 282, and 284 are configured to electrically couple the underlying gate electrodes 250, 251, 252, and 254 of the corresponding transistors with each other or with other circuitry of the semiconductor device. Example materials of the gate contacts 280, 281, 282, and 284 include Ti, TiN, TaN, Co, Ru, Pt, W, Al, Cu, or any combinations thereof.

In the example configuration in 313, the layout further includes source/drains 360, 362, 364, and 366. The source/drains 360, 362, 364, and 366 are arranged between adjacent gate electrodes 250, 251, 252, and 254. In some embodiment, the source/drains have widths along Y-direction in a cell (may also refer to as a first circuit or a first device) that are different from that in another cell (may also refer to as a second circuit or a second device). In FIG. 3B, the width of at least one of the source/drains in the NAND is different from that in the inverter and/or different from that in the NOR.

The source/drain contacts 350, 352, 354, and 356 overlap the corresponding fin lines 210 and 220. The source/drain contacts 350, 352, 354, and 356 are configured to electrically couple the underlying source/drains 360, 362, 364, and 366 of the corresponding transistors with each other or with other circuitry of the semiconductor device. Example materials of the source/drain contacts 350, 352, 354, and 356 include Ti, TiN, TaN, Co, Ru, Pt, W, Al, Cu, or any combinations thereof. In some embodiments, the source/drain contacts 350, 352, 354, and 356 are made of a material that is the same as the gate contacts 280, 281, 282, and 284. Alternatively, in some embodiments, the source/drain contacts 350, 352, 354, and 356 are made of a material that is different from the gate contacts 280, 281, 282, and 284.

In some embodiments, the layout is represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout is presented by at least one first mask corresponding to the fin lines 210 and 220, at least one second mask corresponding to the gate electrodes 250, 251, 252, and 254, and at least one third mask corresponding to the gate spacers 270 and 272.

Figure 4A:
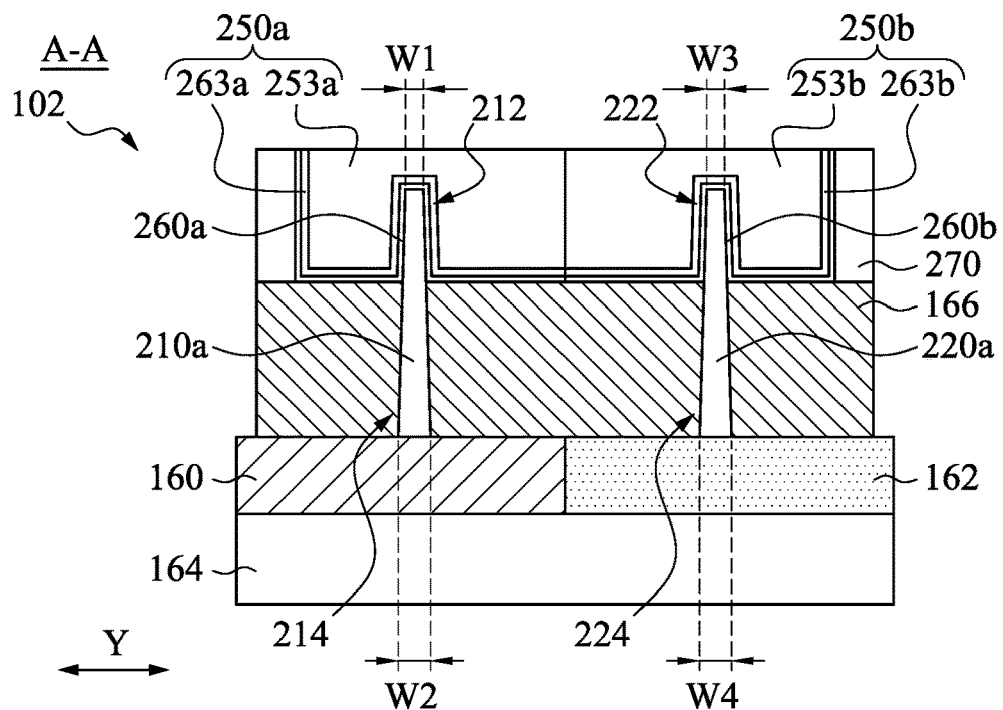
Figure 4B:
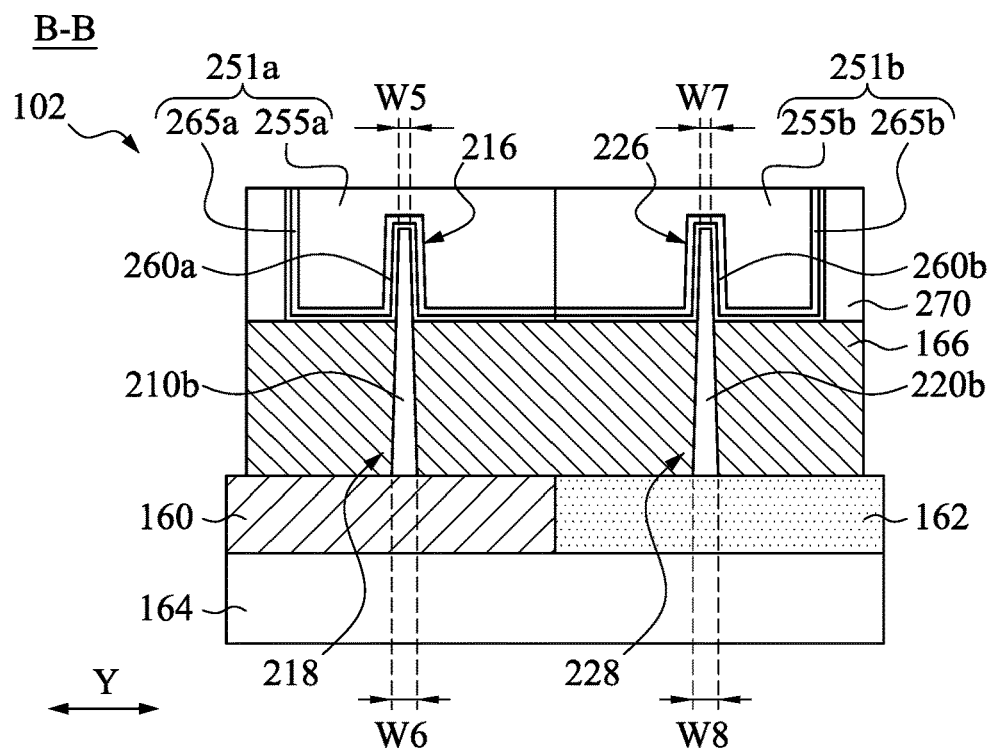
Figure 4C:
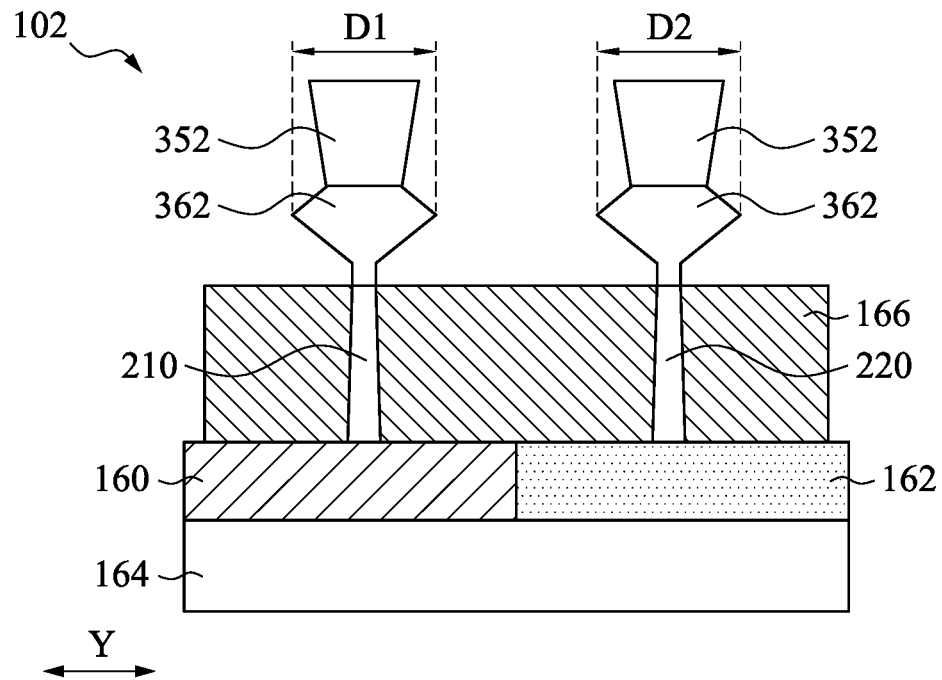
Figure 4D:
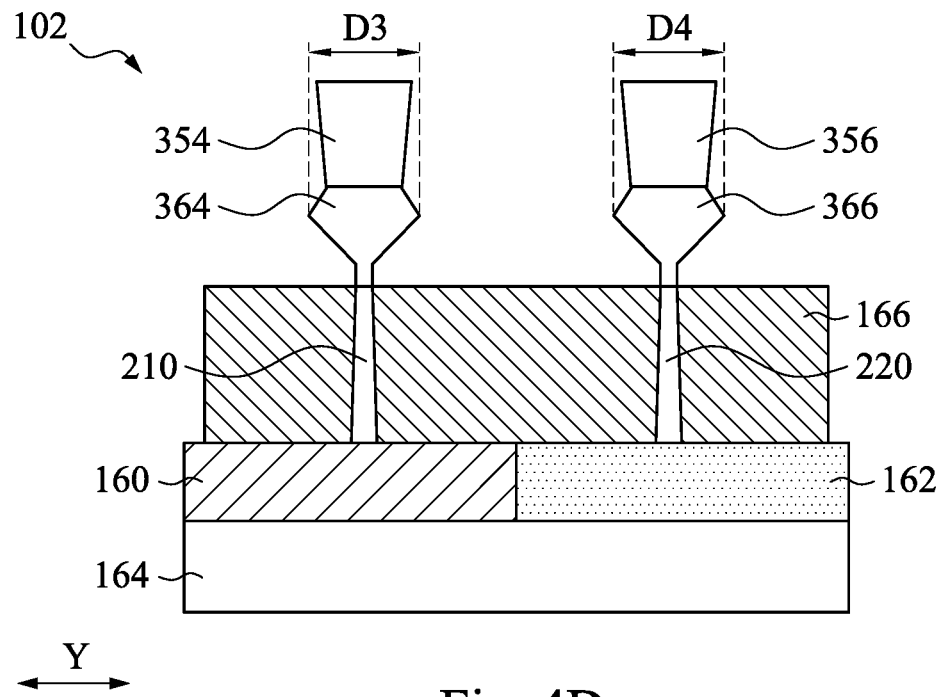
Figure 4F:
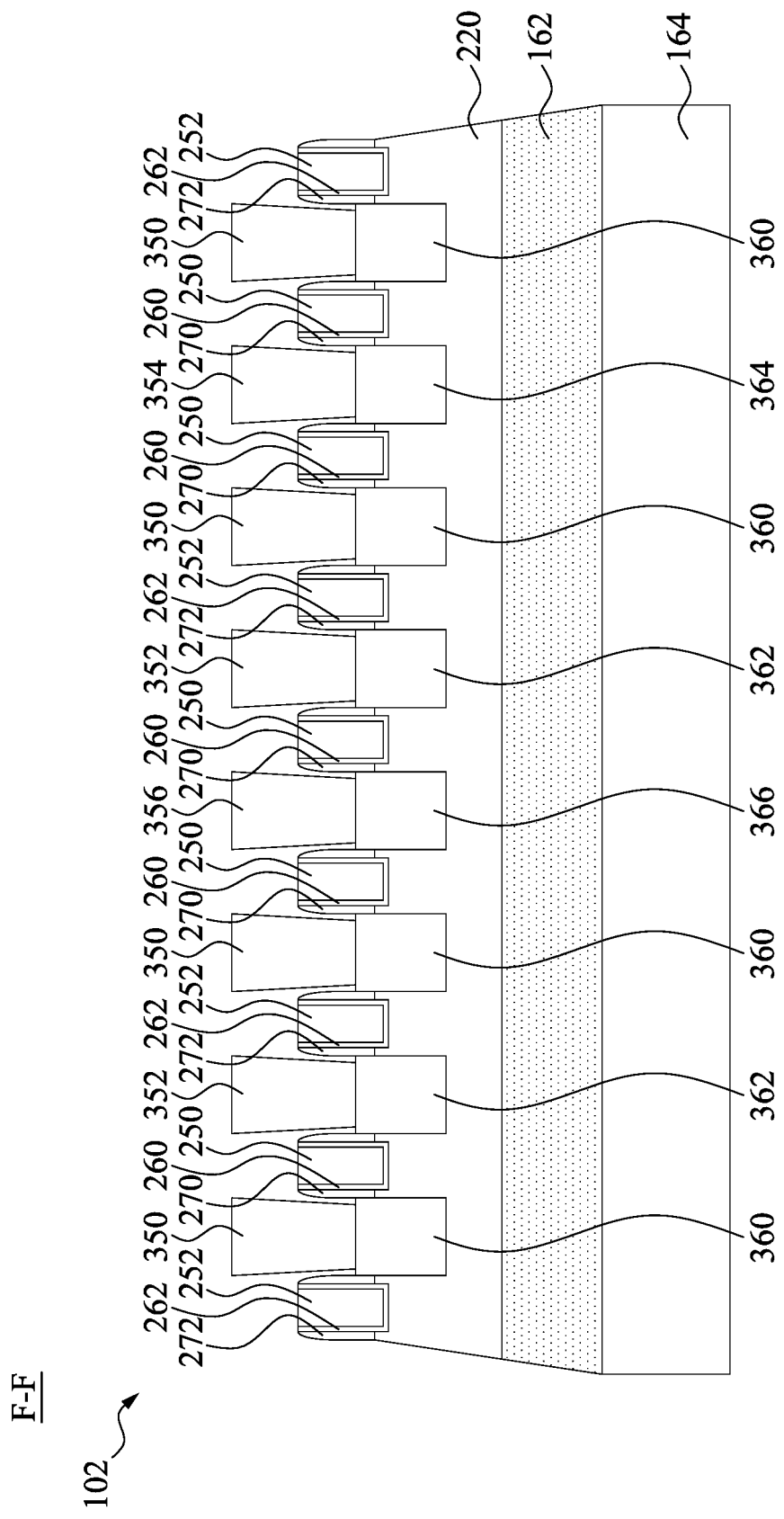

Reference is made to FIGS. 4A-4F. FIGS. 4A-4F illustrate cross-sectional views along line A-A, line B-B, line C-C, line D-D, line E-E, and line F-F respectively. In FIGS. 4A-4F, the forming of a semiconductor 102 is based on the layout shown in FIG. 3B. Specifically, the cross-sectional side view of FIGS. 4A and 4C are obtained by cutting along lines A-A and C-C in the inverter of the top view of the standard cells layout of FIG. 3B. The cross-sectional side view of FIGS. 4B and 4D are obtained by cutting along lines B-B and D-D in the NAND of the top view of the standard cells layout of FIG. 3B. The cross-sectional side view of FIG. 4E is obtained by cutting along line E-E in the N-type well region 160 of the top view of the standard cells layout of FIG. 3B. The cross-sectional side view of FIG. 4F is obtained by cutting along line F-F in the P-type well region 162 of the top view of the standard cells layout of FIG. 3B. For the sake of simplicity, the features on the substrate 164 are designated by the same reference numerals of the corresponding features in FIG. 3B.

As illustrated in FIGS. 4A-4F, the semiconductor device 102 includes a substrate 164 over which various elements of the semiconductor device 102 are formed. The elements of the semiconductor device 102 include active elements and/or passive elements. In some embodiments, active elements are arranged in a circuit region of the semiconductor device to provide one or more functions and/or operations intended to be performed by the semiconductor device. Examples of active elements include, but are not limited to, transistors and diodes. A plurality of metal layers and via layers are alternatingly formed over the substrate 164 to electrically couple the elements of the semiconductor device 102 with each other and/or with external devices. In some embodiments, the substrate 164 includes a silicon substrate. In some embodiments, the substrate 164 includes silicon germanium (SiGe), Gallium arsenic, P-type doped. Si, N-type doped Si, or suitable semiconductor materials. For example, semiconductor materials including group III, group IV, and group V elements are within the scope of various embodiments. In some embodiments, the substrate 164 further includes one or more other features, such as various doped regions, a buried layer, and/or an epitaxy (epi) layer. In some embodiments, the substrate 164 includes a semiconductor on insulator, such as silicon on insulator (SOI). In some embodiments, the substrate 164 includes a doped epi layer, a gradient semiconductor layer, and/or a semiconductor layer overlying another semiconductor layer of a different type such as a silicon layer on a silicon germanium layer.

The semiconductor device 102 further includes one or more well regions over the substrate 164. In some embodiments, the N-type well region 160 and P-type well region 162 are over the substrate 164, as described with respect to FIG. 3B. The semiconductor device 102 further includes the continuous fin lines 210 and 220 forming over the N-type well 160 and the P-type well 162. For the sake of simplicity, the fin lines 210 and 220 (may also refer to as semiconductor fins) on the substrate 164 are designated by the same reference numerals of the corresponding fin lines 210 and 220 as shown in the layout in FIG. 3B.

As shown in FIGS. 4A, 4B, 4C, and 4D, the semiconductor device 102 further includes first gate electrodes 250 and second gate electrodes 251 (shown in FIGS. 4A and 4B), gate dielectric layer 260, and the corresponding gate spacer 270 over the isolation structure 166. Other arrangements are within the scope of various embodiments. For example, in some embodiments, the first gate electrodes 250, the second gate electrodes 251 and/or some of the corresponding gate spacers 270 are partially embedded in the isolation structure 166.

The semiconductor device 102 further includes one or more isolation structures over and around the N-type well region 160 and the P-type well region 162. In the example configuration in FIGS. 4A. 4B, 4C, and 4D, the isolation structure 166 is over the N-type well region 160 and the P-type well region 162. The isolation structure 166 electrically isolates various elements of the semiconductor device 102 from each other. For example, the isolation structure 166 electrically isolates the fin line 210 from the fin line 220. In some embodiments, the isolation structure 166 includes one or more shallow trench isolation (STI) regions. Example materials of the STI regions include, but are not limited to, silicon oxide, silicon nitride, silicon oxynitride, fluoride-doped silicate, and/or any other low k dielectric materials.

In some embodiments, as shown in FIGS. 4A and 4B, the gate electrodes 250 include one or more conductive layers and/or materials. In FIGS. 4A and 4B, the first gate electrode 250 and the second gate electrode 251 each is wrapped over the fin lines 210 and 220. The first gate electrode 250 includes a first conductive gate material 250a over the N-type well region 160 and a second conductive gate material 250b over the P-type well region 162. The second gate electrode 251 includes a first conductive gate material 251a over the N-type well region 160 and a second conductive gate material 251b over the P-type well region 162. In some embodiments, the conductive gate materials 250a and 250b include the same conductive material and/or the conductive gate materials 251a and 251b include the same conductive material. In some embodiments, the conductive gate materials 250a and 250b include different conductive materials and/or the conductive gate materials 251a and 251b include different conductive materials.

In some embodiments, the conductive material or materials of at least one of the conductive gate materials 250a, 250b, 251a, and 251b is/are selected in accordance with the type of device or transistor. For example, the conductive gate materials 250a, 250b, 251a, and 251b include conductive work function layer 263a, 263b, 265a, and 265b respectively. The conductive gate materials 250a, 250b, 251a, and 251b further include contact layers 253a, 253b, 255a, and 255b over the corresponding conductive work function layer. In some embodiments, the work function layer in the first gate electrode 250 is the same as that in the second gate electrode 251. For example, a material of the conductive work function layer 263a in the first gate electrode 250 of the first circuit 201 is the same as a material of the conductive work function layer 265a in the second gate electrode 251 of the second circuit 202. Alternatively, a material of the conductive work function layer 263b in the first gate electrode 250 of the first circuit 201 is the same as a material of the conductive work function layer 265b in the second gate electrode 251 of the second circuit 202.

In some embodiments, the work function layer in the first gate electrode 250 is different from that in the second gate electrode 251. For example, a material of the conductive work function layer 263a in the first gate electrode 250 of the first circuit 201 is different a material of the conductive work function layer 265a in the second gate electrode 251 of the second circuit 202. Alternatively, a material of the conductive work function layer 263b in the first gate electrode 250 of the first circuit 201 is different a material of the conductive work function layer 265b in the second gate electrode 251 of the second circuit 202. Therefore, a threshold voltage of the first circuit 201 is different from a threshold voltage of the second circuit 202, and thus the FinFET devices have a multiple threshold voltage (Vt) in the first, second, and third circuits 201, 202, and 203.

In some embodiments, the first conductive gate material 250a and/or 251a includes a p-type work function metal (p-metal) for forming a PMOS over the N-type well region 160. Example p-metals include, but are not limited to, TiN, TaN, a carbon-doped metal nitride such as TaCN. In some embodiments, the second conductive gate material 250b and/or 251b includes an n-type work function metal (n-metal) for forming an NMOS over the P-type well region 162. Example n-metals include, but are not limited to, Ta, TiAl, and TiAlN. Other work function materials are within the scope of various embodiments. For example, in some embodiments, the work function layer includes doped conducting oxide materials, TaAl, TiSi, NiSi, PtSi, suitable Ti containing work function materials, suitable Ta containing work function materials, suitable Al containing work function materials, and suitable W containing work function materials. In some embodiments, materials of the contact layers 253a, 253b, 255a, and 255b include Ti, TiN, TaN, Co, Ru, Pt, W, Al, Cu, or any combinations thereof. In the example configuration in FIGS. 4A and 4B combined with FIG. 3B, the top surfaces of the gate electrodes 250, 251, 252, and 254 are flush with each other due to, e.g., a planarization process during manufacture. Other arrangements are within the scope of various embodiments.

To electrically isolate the gate electrodes 250 and 251 from the fin lines 210 and 220, gate dielectric layer 260 is arranged under and around the gate electrodes 250 and 251. In FIG. 4A, the first conductive gate material 250a and the second conductive gate material 250b are isolated from the fin lines 210 and 220 by a corresponding gate dielectric layer 260a over the N-type well region 160 and a corresponding gate dielectric layer 260b over the P-type well region 162. In FIG. 4B, the first conductive gate material 251a and the second conductive gate material 251b are isolated from the fin lines 210 and 220 by a corresponding gate dielectric layer 260a over the N-type well region 160 and a corresponding gate dielectric layer 260b over the P-type well region 162. The gate dielectric layers 260a and 260b configure the gate dielectric layer 260 described with respect to FIG. 3B. In some embodiments, the gate dielectric layers 260a and 260b include the same dielectric material. In some embodiments, the gate dielectric layers 260a and 260b include different dielectric materials. In the example configuration in FIG. 3B, the gate electrodes 250 and 251 extends continuously from the N-type well region 160 into the P-type well region 162, and the first conductive gate material 250a is in contact with the second conductive gate material 250b and/or the first conductive gate material 251a is in contact with the second conductive gate material 251b. Other arrangements are within the scope of various embodiments. For example, in some embodiments, at least one of the gate dielectric layers 260a and 260b is interposed between and electrically isolates the first conductive gate material 250a and the second conductive gate material 250b. In some embodiments, at least one of the gate dielectric layers 260a and 260b includes one or more of $HfO_2$, $Ta_2O_5$ and $Al_2O_3$.

In some embodiments, the work function layer, the contact layer and the gate dielectric layer configure a gate stack structure. In some embodiments, the gate stack structure includes a $Si_3N_4$/metals/high-K dielectric structure. The gate spacer 270 is over opposite sides of the corresponding gate dielectric layers 260.

In some embodiments, the width of the fin line 210 under the first gate electrode 250 and in the inverter (may be referred to as a first device) shown in FIG. 4A is different from that under the second gate electrode in the NAND (may be referred to as a first device) shown in FIG. 4B. Specifically, the fin line 210 has a first section 210a in the first circuit 201 and a second section 210b in the second circuit 202. The fin line 220 has a third section 220a in the first circuit 401 and a fourth section 220b in the second circuit 402. The first section 210a of the fin line 210 has a topmost end 212 and a lowest end 214, the second section 210b has a topmost end 216 and a lowermost end 218, the third section 220a has a topmost end 222 and a lowermost end 224, and the fourth section 220b has a topmost end 226 and a lowermost end 228. The topmost ends 212, 216, 222, and 226 of the fin lines 210 and 220 face away from the substrate 164 and the lowermost ends 214, 218, 224, and 228 are adjacent to the substrate 164.

In some embodiments, a width W1 of the topmost end 212 in the first circuit 401 is larger than a width W5 of the topmost end 216 in the second circuit 402 in the Y-direction. A width W2 of the lowermost end 214 in the first circuit 401 is larger than a width W6 of the lowermost end 218 in the second circuit 402 in the Y-direction. A width W3 of the topmost end 222 in the first circuit 401 is larger than a width W7 of the topmost end 226 in the second circuit 402 in the Y-direction. A width W4 of the lowermost end 224 in the first circuit 401 is larger than a width W8 of the lowermost end 228 in the second circuit 402 in the Y-direction. In some embodiments, a ratio of W1/W5 is larger than 1.05, a ratio of W2/W6 is larger than 1.05, a ratio of W3/W7 is larger than 1.05, and/or a ratio of W4/W8 is larger than 1.05. In some embodiment, the first circuit has a first threshold voltage, the second circuit has a second threshold voltage, and the second threshold voltage is higher than the first threshold voltage about 15 mV to about 50 mV.

Due to the reduced of the thickness of the fin line, the circuit can be seemed as an extra low leakage device which may provide both a lower leakage and a lower capacitance for power saving application. In addition, the circuit with thinner fin line has a lower drain induced barrier lowering (DIBL) and a higher Vt compared to the circuit with thicker fin line.

In some embodiment, the first circuit 201 and the second circuit 202 substantially have the same gate pitch, gate critical dimension (CD), gate dielectric and work-function metal layers.

In some embodiments, as shown in FIGS. 4C and 4D, the source/drains 362, 364, and 366 disposed on the tins 210 and 220 and are arranged between adjacent gate electrodes 250, 251, 252, and 254 shown in FIG. 3B. In FIGS. 4C and 4D and combined with FIG. 3B, the semiconductor device 102 further includes source/drain contacts 350, 352, 354, and 356 arranged in the spaces between adjacent gate spacers 270 and 272. As shown in FIGS. 4C and 4D, the fins 210 and 220 each includes source/drains 362, 364, and 366 which are in contact with the corresponding source/drain contact 352, 354, and 356.

In some embodiments, the maximal width along the Y-direction of the source/drains in the inverter (may be referred to as a first device) shown in FIG. 4A is different from that in the NAND (may be referred to as a second device) shown in FIG. 4B. In some embodiments, a maximal width D1 of the source/drain 362 in the first circuit 401 is larger than a maximal width D3 of the source/drain 364 in the second circuit 402 in the Y-direction. A maximal width D2 of the source/drain 362 in the first circuit 401 is larger than a maximal width D4 of the source/drain 366 in the second circuit 402 in the Y-direction. In some embodiments, a ratio of D1/D3 is larger than 1.1, and a ratio of D2/D4 is larger than 1.15. Due to the smaller size of the source/drain, the source/drain can be more spaced apart from the gate electrode, and thus the circuit 202 may have a lower capacitance between the source/drain and the gate.

As shown in FIGS. 4E and 4F. The continuous fin line 210 is formed over the N-type well 160. Source and drain regions 360, 362, 364, and 366 (including common node) are formed in the fin line 210, and gate electrodes 250, 251 and 254, gate dielectric 260 and 264, and gate spacer 270 and 272 are formed over the fin line 210. The source/drain contacts 350, 352, 354, and 356 are formed over the source/drains 360, 362, 364, and 366 respectively to provide electrical connectivity thereto.

In some embodiments, portions of the fin line 210 and/or 220 between the adjacent spacers 270 and 272 are recessed to form source/drain cavities having bottom surfaces lower than the top surface of the fin line 210 and/or 220. After the formation of the source/drain cavities, source/drains 360, 362, 364, and 366 are produced by epi-growing a strained material in the source/drain cavities. In some embodiments, the lattice constant of the strained material is different from the lattice constant of the substrate 164. Thus, channel regions of the semiconductor device are strained or stressed to enhance carrier mobility of the device.

For example, for a PMOS device, the strained material is configured to apply a compressive stress to enhance hole mobility in the at least one source or drain region of the PMOS device. For an NMOS device, the strained material is configured to apply a tensile stress to enhance electron mobility in the at least one source or drain region of the PMOS device. Examples of the strained material include, but are not limited to, SiGe, SiGeC, SiC, GeSn, SiGeSn, SiP, SiCP and other suitable materials. In some embodiments, the strained material for a PMOS device includes SiGe, SiGeC, Ge, Si, or a combination thereof. In some embodiments, the strained material for an NMOS device includes SiC, SiP, SiCP, Si, or a combination thereof. In the example configuration in FIGS. 4E and 4F, upper surfaces of the strained material in the source/drains 360, 362, 364, and 366 extend upward above top surface of the fin line 210 and/or 220. Other arrangements are within the scope of various embodiments. For example, in some embodiments, upper surfaces of the strained material in the source/drains 360, 362, 364, and 366 are lower than the top surface of the fin line 210 and/or 220.

As shown in FIG. 4F, the standard cell has a P-type well 162 formed in the substrate 164. The continuous fin line 220 is formed over the P-type well 162. Source and drain regions 360, 362, 364, and 366 (including common node) are formed in the fin line 220, and gate electrodes 250, 251 and 252, gate dielectric 260 and 262, and gate spacer 270 and 272 are formed over the fin line 220. The source/drain contacts 350, 352, 354, and 356 are formed over the source/drains 360, 362, 364, and 366 respectively to provide electrical connectivity thereto.

Figure 5:
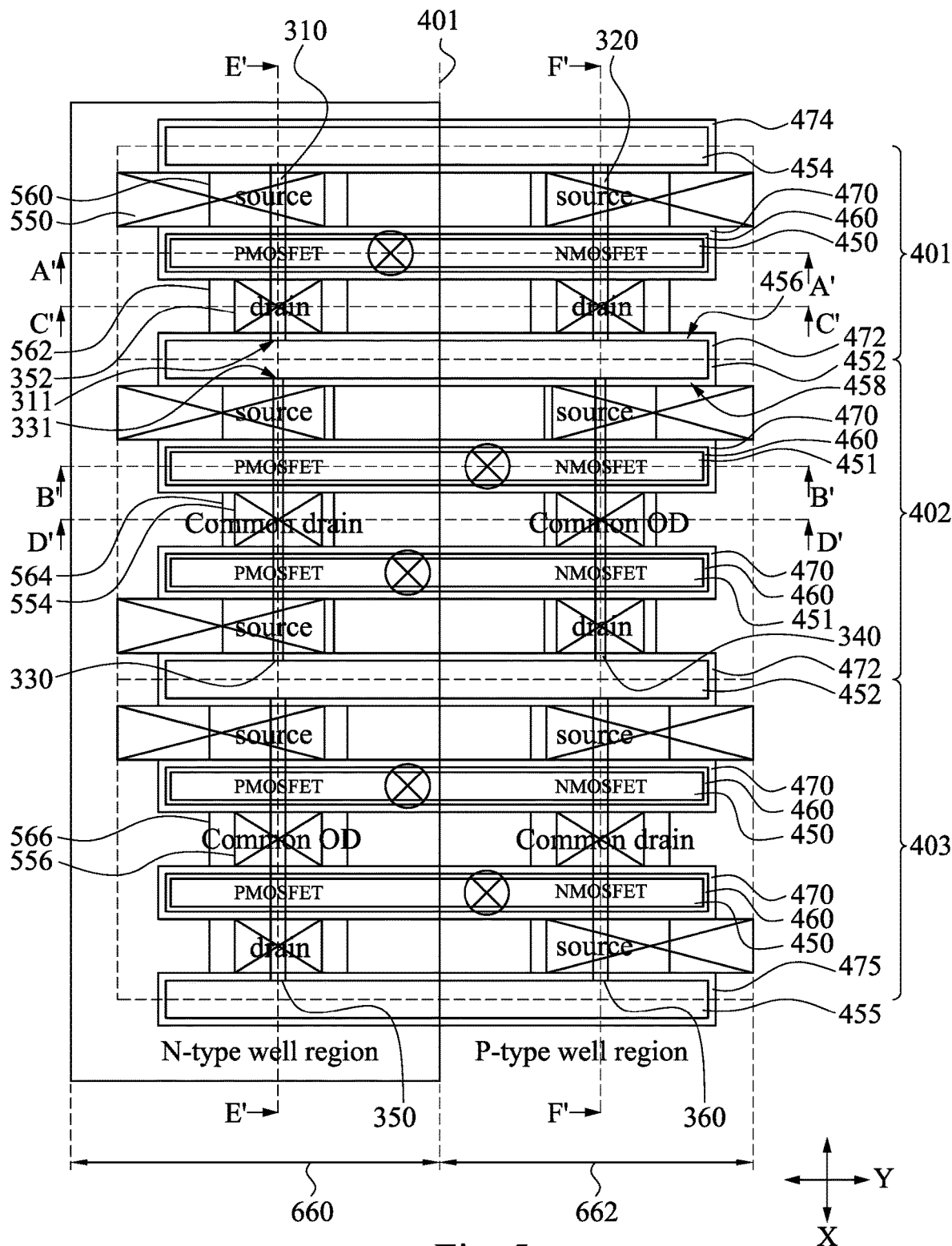
FIG. 5 is the top view of another layout according to some embodiments of the present disclosure.

FIG. 5 illustrates the top view of another layout corresponding to the logic gates shown in FIG. 3A according to some embodiments of the present disclosure. It is understood that the top view layout shown in FIG. 5 may correspond to one or more of the STD cells (or portions thereof) shown in FIG. 2. The layout includes a first circuit 401, a second circuit 402, and a third circuit 403. At least two of the first circuit 401, the second circuit 402, and the third circuit 403 are different type of circuits form each other. As examples, the logic gates shown in FIG. 5 includes an inverter gate, a NAND gate, and a NOR gate. The inverter gate, the NAND gate, and the NOR gate each include one or more N-type MOSFETs (NMOSFET) and one or more P-type MOSFETs (PMOSFETs). The particular type of logic gate is determined by coupling the gate, source, and drain of the NMOSFETs and PMOSFETs in a specific configuration as shown in FIG. 3A. The input terminal and output terminal of each logic gate is also labeled in FIG. 3A as such.

The top view layout of FIG. 5 illustrates PMOSFETs with an N-type well region 660 and NMOSFETs with a P-type well region 662. The N-type well region 660 and the P-type well region 662 are on opposite side of an imaginary line 401 which divides the semiconductor device into separate regions for different types of devices or transistors. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), FinFETs, planar MOS transistors with raised source/drains, or the like. In the example configuration in FIG. 1A, the N-type well region 660 is a region for forming p-channel metal-oxide semiconductor (PMOS) transistors, and the P-type well region 662 is a region for forming n-channel metal-oxide semiconductor (NMOS) transistors. The described conductivity of the well regions 460 and 462 herein is an example. Other arrangements are within the scope of various embodiments.

A plurality of elongated fin lines 310, 320, 330, 340, 350, and 360 (may also refer to as semiconductor fins in the manufacturing base on the fin lines shown in the layout) extend in an elongated manner in the X-direction. The fin lines 310, 330, and 350 are part of the PMOSFET, and the fin lines 320, 340, and 360 are part of the NMOSFET. The PMOSFET fin lines 310, 330, and 350 are located over the N-type well region 660, whereas the NMOSFET fin lines 320, 340, and 360 are located over the P-type well region 662. In some embodiments, the fin lines 310, 320, 330, 340, 350, and 360 are also referred to as oxide-definition (OD) regions. Example materials of the fin lines 310, 320, 330, 340, 350, and 360 include, but are not limited to, semiconductor materials doped with various types of p-dopants and/or n-dopants. In some embodiments, the fin lines 310, 320, 330, 340, 350, and 360 include dopants of the same type. In some embodiments, one of the fin lines 310, 320, 330, 340, 350, and 360 includes dopants of a type different from a type of dopants of another one of the fin lines 310, 320, 330, 340, 350, and 360. The fin lines 310, 320, 330, 340, 350, and 360 are isolated from each other by one or more isolation structures as described herein. The fin lines 310, 320, 330, 340, 350, and 360 are within corresponding well regions.

As discussed above with reference to FIG. 1A, the fin lines 310, 320, 330, 340, 350, and 360 each include a channel region as well as source/drain regions located next to (e.g., on opposite sides of) the channel region. In the present embodiments, the PMOSFET fin lines 310, 330, and 350 are comprised of a silicon germanium (SiGe) material (for strain effect enhancement), but the NMOSFET fin lines 320, 340, and 360 are comprised of a non-germanium-containing semiconductor material, for example Si. The fin lines 310, 320, 330, 340, 350, and 360 are each continuous, for example they each extend across three or more abutted cells (abutted in the X-direction).

In the FIG. 5, the first circuit 401 corresponds to the first circuit 201 shown in FIG. 3B, with a difference in that the gate electrodes 252 and 254, the corresponding gate dielectric layers 262 and 264, and the corresponding gate spacer 272 are omitted in the first circuit 401. The dummy gate 452 and the corresponding spacer 472 of the first circuit 401 replace the omitted gate electrodes 252 and 254, the corresponding gate dielectric layers 262 and 264, and the corresponding gate spacer 272 in the first circuit 401 shown in FIG. 5. The dummy gate 452 corresponds to a common edge of the first circuit 401 and the second circuit 402 which abut each other. The first circuit 401 has a further edge corresponding to the dummy gate 454.

In some embodiments, the second circuit 402 corresponds to the second circuit 202 shown in FIG. 3B, with a difference in that the gate electrodes 252 and 254, the corresponding gate dielectric layers 262 and 264, and the corresponding gate spacer 272 are omitted in the second circuit 402 which are replaced by the dummy gate 452 and the corresponding spacer 472 of the second circuit 402 in FIG. 5. The dummy gate 452 corresponds to a common edge of the first circuit 401 and the second circuit 402 and/or the second circuit 402 and the third circuit 403 which abut each other. In some embodiments, the third circuit 403 corresponds to the third circuit 201 shown in FIG. 3B, with a difference in that the gate electrodes 252 and 254, the corresponding gate dielectric layers 262 and 264, and the corresponding gate spacer 272 are omitted in the first circuit 401 which are replaced by the dummy gate 452 and the corresponding spacer 472 of the third circuit 403 in FIG. 5. The dummy gate 452 corresponds to a common edge of the third circuit 403 and the second circuit 402 which abut each other. The third circuit 403 has a further edge corresponding to the dummy gate 455.

In some embodiments, to ensure electrical isolation between the active area regions of the first circuit 401 and the corresponding active area regions of the second circuit 402, the active area regions are terminated at, or in vicinities of, corresponding edges of the common dielectric dummy gate 452. In the example configuration in FIG. 5, an upper edge 331 of the fin line 330 terminates at a corresponding lower edge 458 of the common dummy gate 563, and a lower edge 311 of the fin line 310 terminates at a corresponding upper edge 456 of the common dummy gate 452. As a result, the upper edge 331 of the fin line 320 and the lower edge 311 of the fin line 310 are spaced and electrically isolated by the common dummy gate 452. Similarly, lower edges of the fin line 320 terminate at the upper edge 456 of the common dummy gate 452, and are spaced and electrically isolated by the common dummy gate 452 from corresponding upper edges of the fins 340 which terminate at the lower edge 458 of the common dummy gate 452.

In the example configuration in FIG. 5, upper edges of the fin lines 310 and 320 terminate at a lower edge of the dummy gate 454, and lower edges of the fin lines 350 and 360 terminate at an upper edge of the dummy gate 455. Other arrangements are within the scope of various embodiments. For example, in at least one embodiment, the upper edges of the fin lines 310 and 320 extend upwardly beyond the lower edge of the dummy gate 454 and/or the lower edges of the fin lines 350 and 360 extend downwardly beyond the upper edge of the dummy gate 455. Example dielectric materials of the dummy gates 452, 454, and 455 include, but are not limited to, oxide-based dielectric materials, such as $SiO_2$, SiON, $Si_3N_4$, SiOCN and combinations thereof. In at least one embodiment, the gate electrodes include one or more metal materials, and the dummy gates 452, 454, and 455 are free of the metal materials of the gate electrodes.

In some embodiments, a width of the fin line 310 and/or the fin line 320 in the first circuit 401 is different from that of the fin line 330 and/or the fin line 340 in the second circuit 402. In some embodiments, a width of the fin line 330 and/or the fin line 340 in the second circuit 402 is different from that of the fin line 350 and/or the fin line 360 in the third device. Specifically, a width of at least one the fin lines under a gate electrode in the second circuit 402 is different from that of a width of at least one of the fin lines under another gate electrode in the first or third device.

A plurality of first gate electrodes 450 and a plurality of second gate electrodes 451 extend along the Y-direction and are across the fin lines 310, 320, 330, 340, 350, and 360. Example materials of the first gate electrodes 450 and the second gate electrodes 451 include, but are not limited to, polysilicon and metal. Other materials are within the scope of various embodiments. The first gate electrodes 450, the second gate electrodes 451, and the fin lines 310 and 320 form one or more transistors. One or more of the first gate electrodes 450 and the second gate electrodes 451 are coupled to other circuitry of the semiconductor device by corresponding gate contacts.

Specifically, in each of the circuit cells (e.g., the inverter, NAND, or NOR) one or more CMOS gate electrodes 450 and 451 extend into both the N-type well region 660 and the P-type well region 662 in the Y-direction. The portion of the gate electrodes 450 and 451 located over the N-type well region 660 forms the gate of the PMOSFET, and the portion of the gate electrodes 450 and 451 located over the P-type well region 662 forms the gate of the NMOSFET. Each of the first gate electrodes 450 and the second gate electrodes 451 wraps around the fin lines 310, 320, 330, 340, 350, and 360 in the manner described above with reference to FIG. 1A. For example, the gate electrodes 450 and 451 in the PMOSFET wrap around the fin lines 310, and the gate electrodes 450 and 451 in the NMOSFET wrap around the fin line 320. The source/drain contacts (providing electrical connectivity to the source/drains of the FinFETs) are also illustrated in the top view layout of FIG. 5, some examples of which are labeled herein as source contacts 550 and drain contacts 552. It is understood that silicide layers may be formed on the source/drain regions, and the source/drain contacts may be formed on the silicide layers.

Due at least in part to locations and the electrical configuration of the dummy gate 452, 454, and 455, the PMOSFET isolation transistors provide electrical isolation between the adjacent circuit cells for the PMOSFET, for example between the inverter cell and the NAND cell, or between the NAND cell and the NOR cell. Similarly, the NMOSFET isolation transistors provide electrical isolation between the adjacent circuit cells for the NMOSFET, for example between the inverter cell and the NAND cell, or between the NAND cell and the NOR cell.

In some embodiments, to electrically isolate the gate electrodes 450 from the fin lines 310, 320, 350, and 360 and to isolate the gate electrodes 451 from the fin lines 330 and 340, gate dielectric layers 460 are arranged under and around the corresponding gate electrodes 450. Example materials of the gate dielectric layers 460 include, but are not limited to, silicon nitride, silicon oxynitride, metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide. In some embodiments, the gate dielectric layers 460 include multi-layer structure.

In some embodiments, gate spacers 470, 472, 474, and 475 are at least arranged along sides of the corresponding gate electrodes 450 and 451 and the dummy gates 452, 454, and 455. For example, the gate spacer 470 is arranged along longitudinal sides of the gate electrodes 450 and 451 in the Y-direction, the gate spacers 472, 474, and 475 are arranged along longitudinal sides of the dummy gates 452, 454, and 455. The gate spacers 470, 472, 474, and 475 include one or more dielectric materials. Example dielectric materials of the gate spacers 470, 472, 474, and 475 include, but are not limited to, silicon nitride, oxynitride and silicon carbide.

The gate contacts 480 and 481 are configured to electrically couple the underlying first gate electrode 450 and the second gate electrodes 451 of the corresponding transistors with each other or with other circuitry of the semiconductor device. The gate contact 481 is configured to electrically couple the underlying second gate electrode 451 of the corresponding transistors with each other or with other circuitry of the semiconductor device. Example materials of the gate contacts 480 and 481 include Ti, TiN, TaN, Co, Ru, Pt, W, Al, Cu, or any combinations thereof.

In the example configuration in FIG. 5, the layout further includes source/drains 560, 562, 564, and 566. The source/drains 560, 562, 564, and 566 are arranged between adjacent gate electrodes 450 and 451 or between the gate electrode 450 and the dummy gate 452, 454 or 455. In some embodiment, the source/drains have widths along Y-direction in a cell (or a first device) that are different from that in another cell (or a second device). In FIG. 5, the width of at least one of the source/drains in the first circuit 401 is different from that in the second circuit 402 and/or different from that in the third circuit 403.

The source/drain contacts 550, 552, 554, and 556 overlap the corresponding fin lines 310, 320, 330, 340, 350, and 360. The source/drain contacts 550, 552, 554, and 556 are configured to electrically couple the underlying source/drains 560, 562, 564, and 566 of the corresponding transistors with each other or with other circuitry of the semiconductor device. Example materials of the source/drain contacts 550, 552, 554, and 556 include Ti, TiN, TaN, Co, Ru, Pt, W, Al, Cu, or any combinations thereof. In some embodiments, the source/drain contacts 550, 552, 554, and 556 are made of a material that is the same as the gate contact 480 and/or 481. Alternatively, in some embodiments, the source/drain contacts 550, 552, 554, and 556 are made of a material that is different from the gate contact 480 and/or 481.

In some embodiments, the layout is represented by a plurality of masks generated by one or more processors and/or stored in one or more non-transitory computer-readable media. Other formats for representing the layout are within the scope of various embodiments. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like. For example, the layout is presented by at least one first mask corresponding to the fin lines 310, 320, 330, 340, 350, and 360, at least one second mask corresponding to the first gate electrodes 450, the second gate electrodes 451, the dummy gate 452, 454, and 455, and at least one third mask corresponding to the gate spacers 470 and 472.

Figure 6A:
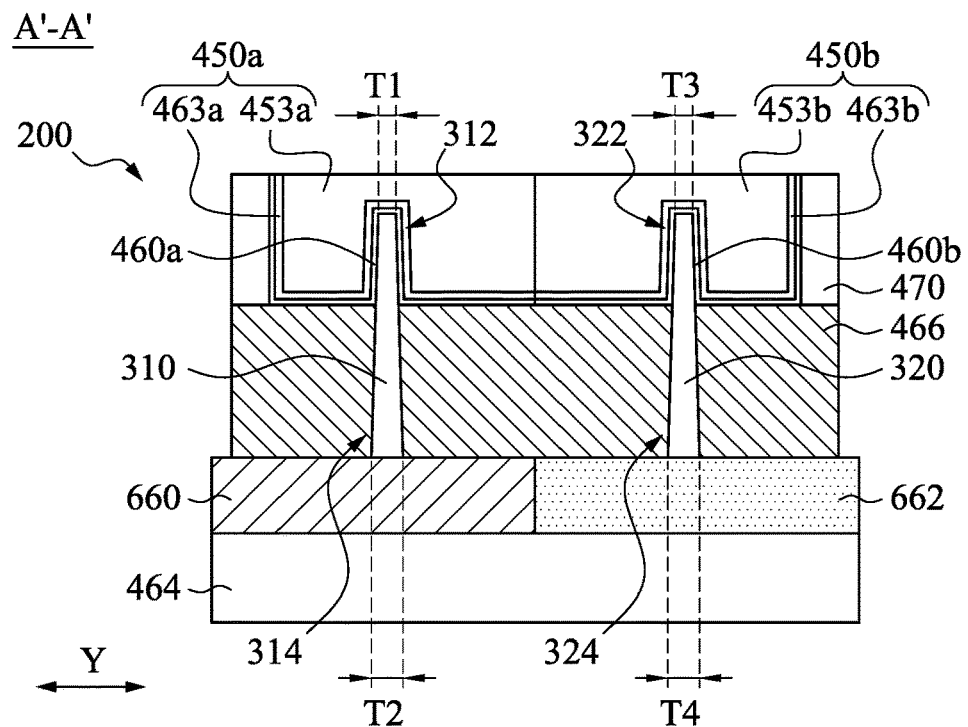
FIGS. 6A-6F are cross-sectional views along line A'-A', line B'-B', line C'-C', line D'-D', line E'-E', and line F'-F' respectively.
Figure 6B:
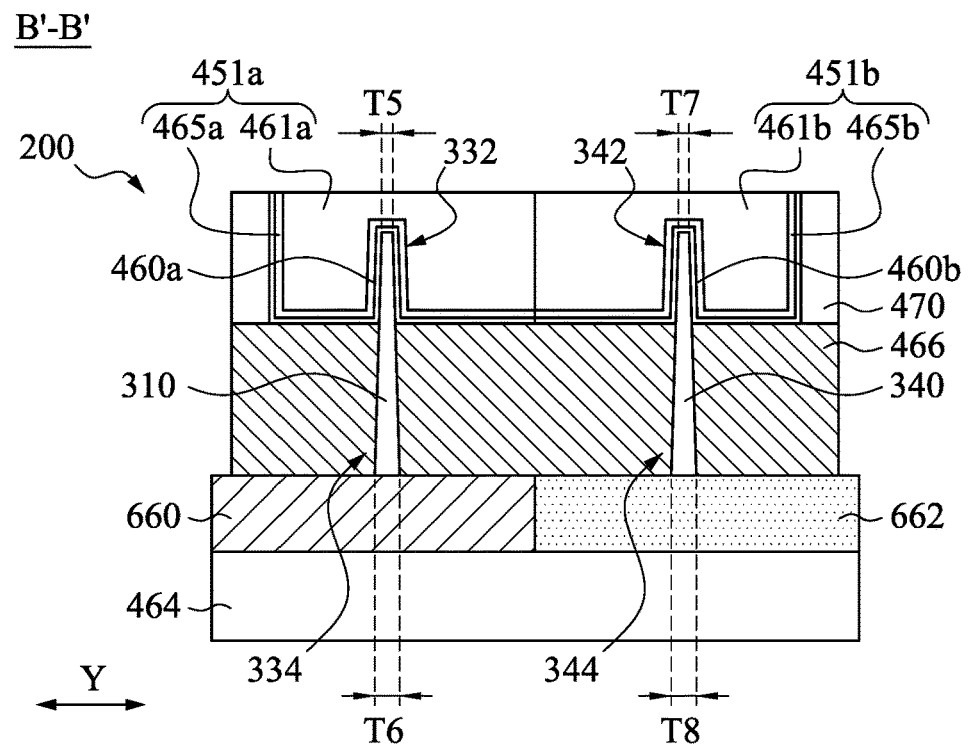
Figure 6C:
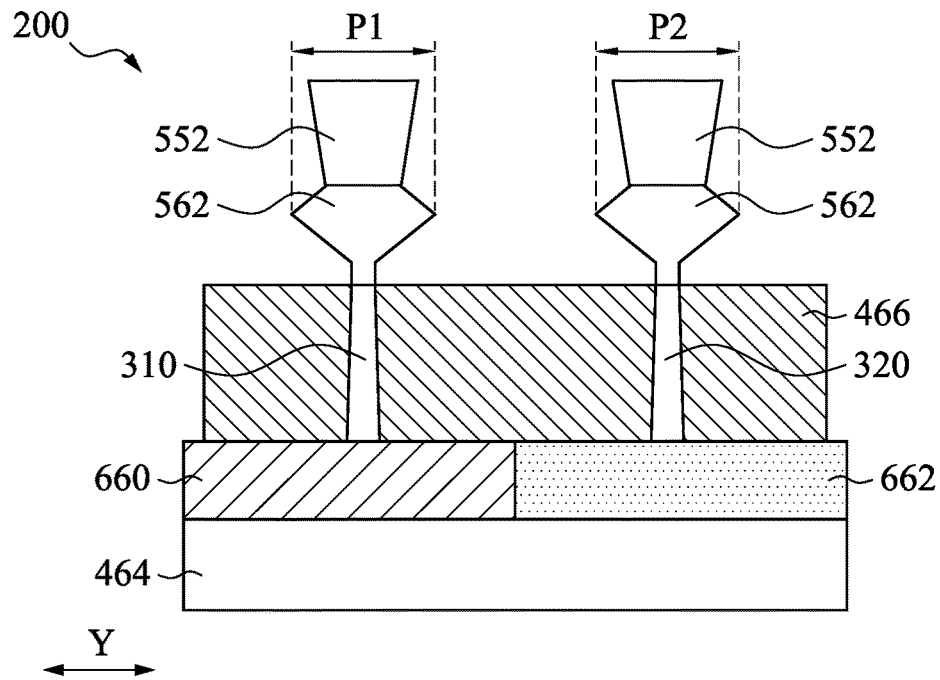
Figure 6D:
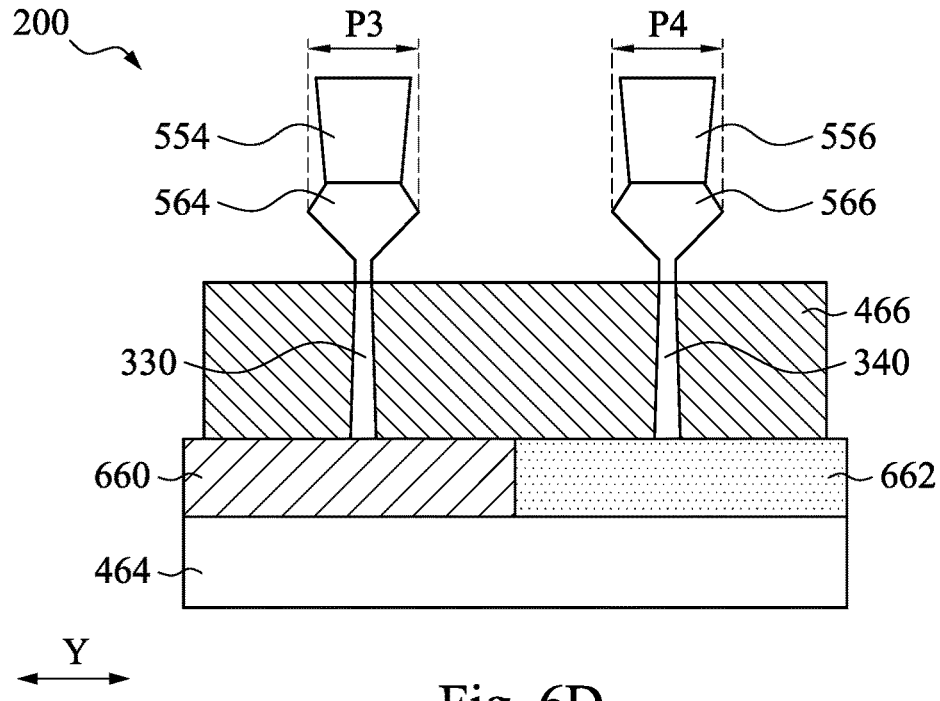
Figure 6E:
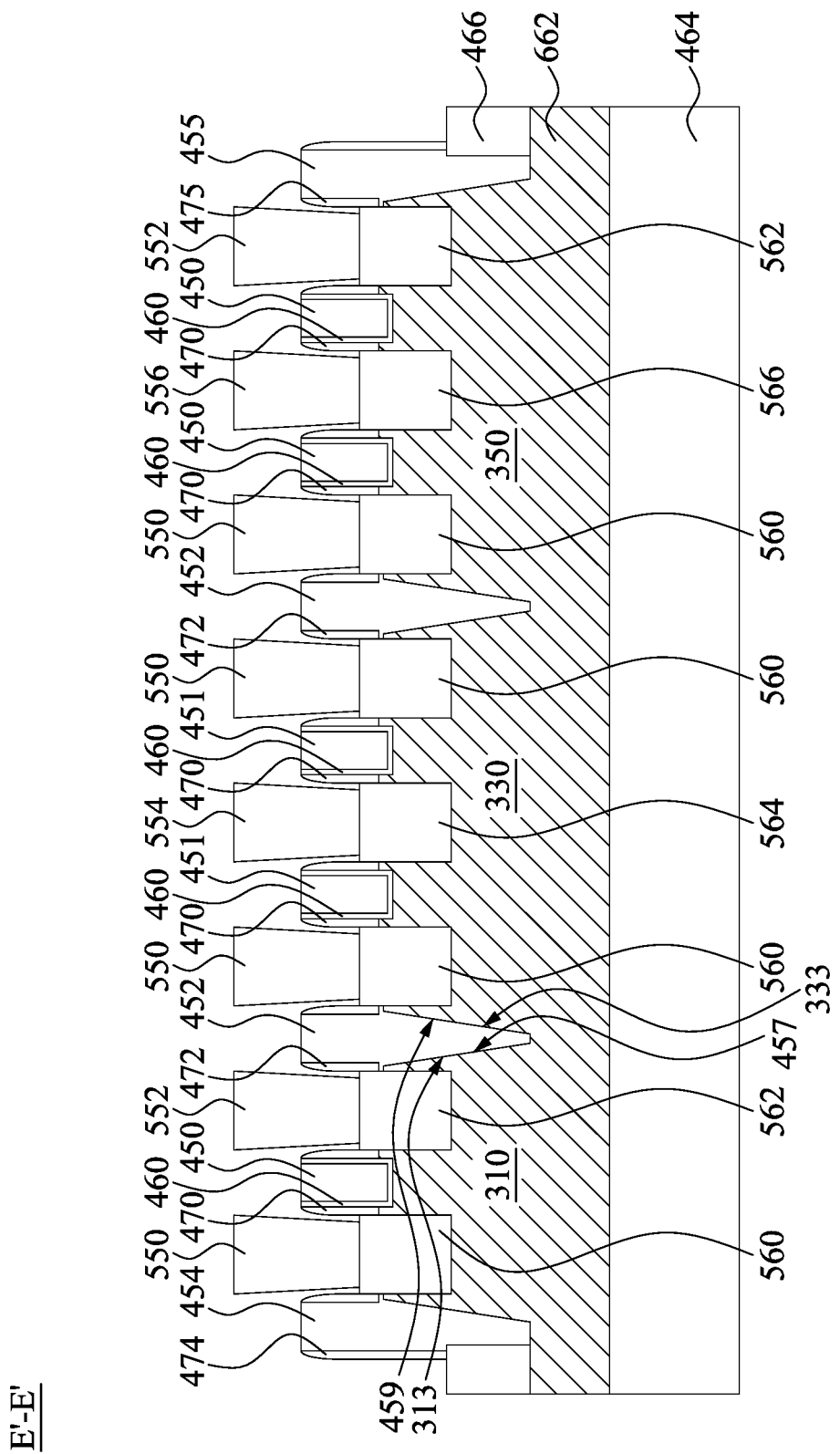
Figure 6F:
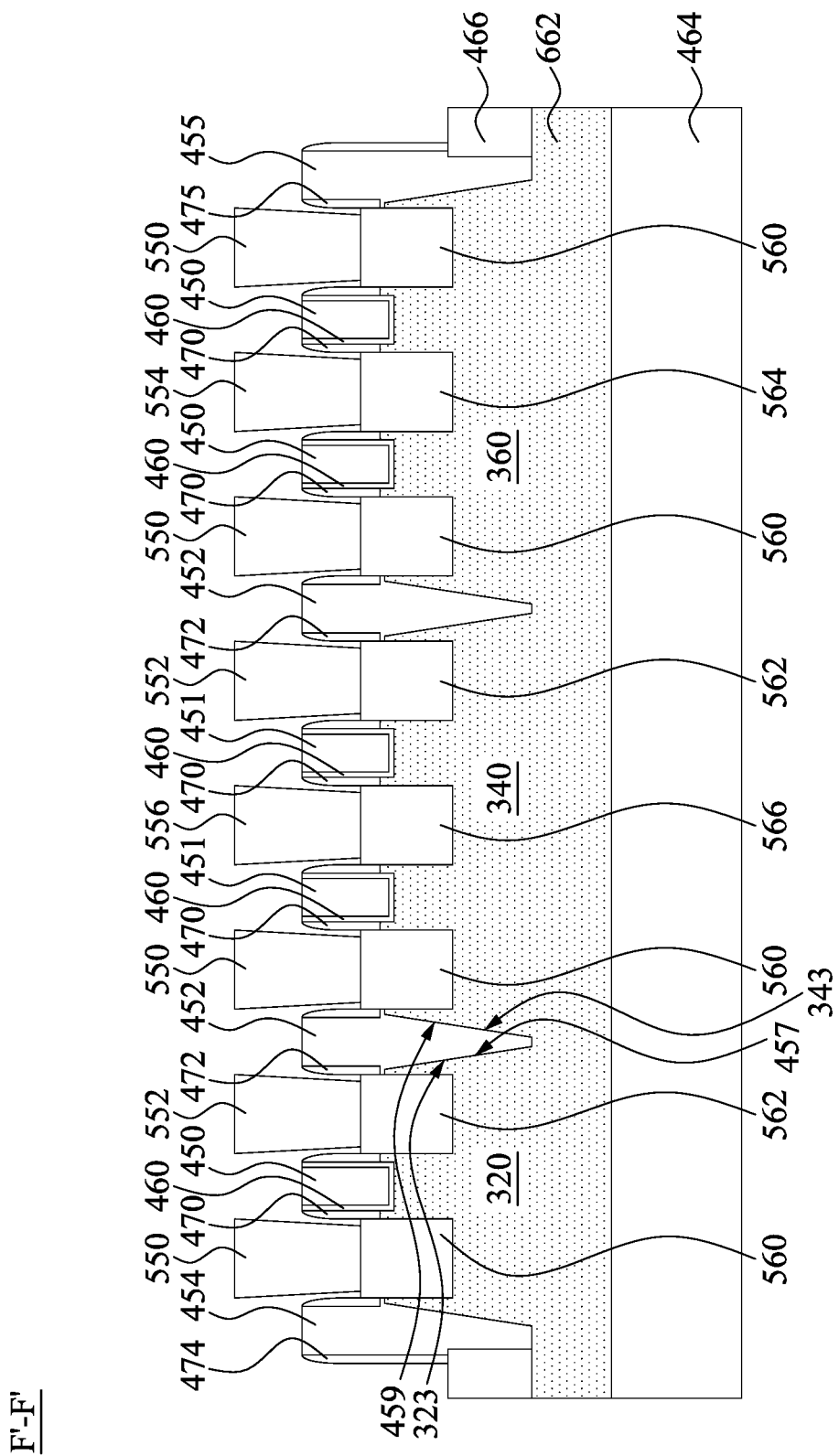

Reference is made to FIGS. 6A-6F. FIGS. 6A-6F illustrate cross-sectional views along line A'-A', line B'-B', line C'-C', line D'-D', line E'-E', and line F'-F' respectively. In FIGS. 6A-6F, the forming of a semiconductor 200 is based on the layout shown in FIG. 5. Specifically, the cross-sectional side view of FIGS. 6A and 6C are obtained by cutting along lines A-A and C-C in the first circuit 401 of the top view of the standard cells layout of FIG. 5. The cross-sectional side view of FIGS. 6B and 6D are obtained by cutting along lines B-B and D-D in the second circuit 402 of the top view of the standard cells layout of FIG. 5. The cross-sectional side view of FIG. 6E is obtained by cutting along line E-E in the N-type well region 660 of the top view of the standard cells layout of FIG. 5. The cross-sectional side view of FIG. 6F is obtained by cutting along line F-F in the P-type well region 662 of the top view of the standard cells layout of FIG. 5. For the sake of simplicity, the features on the substrate 464 are designated by the same reference numerals of the corresponding features in FIG. 5.

As illustrated in FIGS. 6A-6F, the semiconductor device 200 includes a substrate 464 over which various elements of the semiconductor device 200 are formed. The elements of the semiconductor device 200 include active elements and/or passive elements. In some embodiments, active elements are arranged in a circuit region of the semiconductor device to provide one or more functions and/or operations intended to be performed by the semiconductor device. Examples of active elements include, but are not limited to, transistors and diodes. A plurality of metal layers and via layers are alternatingly formed over the substrate 464 to electrically couple the elements of the semiconductor device 200 with each other and/or with external devices, as described with respect to FIG. 5. In some embodiments, the substrate 464 can be corresponded to the substrate 164 shown in FIGS. 4A to 4F.

The semiconductor device 200 further includes one or more well regions over the substrate 464. In some embodiments, the N-type well region 660 and P-type well region 662 are over the substrate 464, as described with respect to FIGS. 4A-4F. The semiconductor device 200 further includes the continuous fin lines 310, 320, 330, 340, 350, and 360 forming over the N-type well 460 and the P-type well 462. For the sake of simplicity, the fin lines 310, 320, 330, 340, 350, and 360 (may also refer to as semiconductor fins) on the substrate 464 are designated by the same reference numerals of the corresponding fin lines 310, 320, 330, 340, 350, and 360 as shown in the layout in FIG. 5.

As shown in FIGS. 6A-6F, the semiconductor device 200 further includes the first gate electrodes 450, the second gate electrodes 451 (shown in FIGS. 6A and 6B), gate dielectric layer 460, and the corresponding gate spacer 470 over the isolation structure 466. Other arrangements are within the scope of various embodiments. For example, in some embodiments, the first gate electrodes 450, the second gate electrodes 451 and/or some of the corresponding gate spacers 470 are partially embedded in the isolation structure 466.

The semiconductor device 200 further includes one or more isolation structures over and around the N-type well region 660 and the P-type well region 662. In the example configuration in FIGS. 6A-6D, the isolation structure 466 is over the N-type well region 660 and the P-type well region 662. The isolation structure 466 electrically isolates various elements of the semiconductor device 200 from each other. For example, the isolation structure 466 electrically isolates the fin line 310 from the fin line 320. In some embodiments, the isolation structure 466 includes one or more shallow trench isolation (STI) regions. Example materials of the STI regions include, but are not limited to, silicon oxide, silicon nitride, silicon oxynitride, fluoride-doped silicate, and/or any other low k dielectric materials.

In some embodiments, as shown in FIGS. 6A and 6B, the first gate electrodes 450 and/or the second gate electrodes 451 include one or more conductive layers and/or materials. In FIGS. 6A and 6B, the first gate electrodes 450 and the second gate electrodes 451 each is wrapped over the fin lines 310 and 320. In FIG. 6A, the first gate electrode 450 includes a first conductive gate material 450a over the N-type well region 660 and a second conductive gate material 450b over the P-type well region 662. In FIG. 6B, the second gate electrode 451 includes a first conductive gate material 451a over the N-type well region 660 and a second conductive gate material 451b over the P-type well region 662. In some embodiments, the conductive gate materials 450a and 450b include the same conductive material and/or the conductive gate materials 451a and 451b include the same conductive material. In some embodiments, the conductive gate materials 450a and 450b include different conductive materials and/or the conductive gate materials 451a and 451b include different conductive materials.

In some embodiments, the conductive material or materials of at least one of the conductive gate materials 450a, 450b, 451a, and 451b is/are selected in accordance with the type of device or transistor. For example, the conductive gate materials 450a, 450b, 451a, and 451b include conductive work function layer 463a, 463b, 465a, and 465b respectively. The conductive gate materials 450a, 450b, 451a, and 451b further include contact layers 453a, 453b, 461a, and 461b over the corresponding conductive work function layer. In some embodiments, the work function layer in the first gate electrode 450 is the same as that in the second gate electrode 451. For example, a material of the conductive work function layer 463a in the first gate electrode 450 of the first circuit 401 is the same as a material of the conductive work function layer 465a in the second gate electrode 451 of the second circuit 402. Alternatively, a material of the conductive work function layer 463b in the first gate electrode 450 of the first circuit 401 is the same as a material of the conductive work function layer 465b in the second gate electrode 451 of the second circuit 402.

In some embodiments, the work function layer in the first gate electrode 450 is different from that in the second gate electrode 451. For example, a material of the conductive work function layer 463a in the first gate electrode 450 of the first circuit 401 is different a material of the conductive work function layer 465a in the second gate electrode 451 of the second circuit 402. Alternatively, a material of the conductive work function layer 463b in the first gate electrode 450 of the first circuit 401 is different a material of the conductive work function layer 465b in the second gate electrode 451 of the second circuit 402. Therefore, a threshold voltage of the first circuit 401 is different from a threshold voltage of the second circuit 402, and thus the FinFET devices have a multiple threshold voltage (Vt) in the first, second, and third circuits 401, 402, and 403.

In some embodiments, the first conductive gate material 450a and/or 451a includes a p-type work function metal (p-metal) for forming a PMOS over the N-type well region 660. Example p-metals include, but are not limited to, TiN, TaN, a carbon-doped metal nitride such as TaCN. In some embodiments, the second conductive gate material 450b and/or 451b includes an n-type work function metal (n-metal) for forming an NMOS over the P-type well region 662. Example n-metals include, but are not limited to, Ta, TiAl, and TiAlN. Other work function materials are within the scope of various embodiments. For example, in some embodiments, the work function layer includes doped conducting oxide materials, TaAl, TiSi, NiSi, PtSi, suitable Ti containing work function materials, suitable Ta containing work function materials, suitable Al containing work function materials, and suitable W containing work function materials. In some embodiments, materials of the contact layers 453a, 453b, 461a, and 461b include Ti, TiN, TaN, Co, Ru, Pt, W, Al, Cu, or any combinations thereof. In the example configuration in FIGS. 6A and 6B combined with FIG. 5, the top surfaces of the gate electrodes 450 and 451 and the dummy gate 452, 454, and 455 are flush with each other due to, e.g., a planarization process during manufacture. Other arrangements are within the scope of various embodiments.

To electrically isolate the first gate electrodes 450 and the second gate electrodes 451 from the fin lines 310 and 320, gate dielectric layer 460 is arranged under and around the gate electrode 450. In FIG. 6A, the first conductive gate material 450a and the second conductive gate material 450b are isolated from the fin lines 310 and 320 by a corresponding gate dielectric layer 460a over the N-type well region 660 and a corresponding gate dielectric layer 460b over the P-type well region 662. In FIG. 6B, the first conductive gate material 451a and the second conductive gate material 451b are isolated from the fin lines 310 and 320 by a corresponding gate dielectric layer 460a over the N-type well region 660 and a corresponding gate dielectric layer 460b over the P-type well region 662. The gate dielectric layers 460a and 460b configure the gate dielectric layer 460 described with respect to FIG. 5. In some embodiments, the gate dielectric layers 460a and 460b include the same dielectric material. In some embodiments, the gate dielectric layers 460a and 460b include different dielectric materials. In the example configuration in FIG. 5, the first gate electrodes 450 and the second gate electrodes 451 extends continuously from the N-type well region 660 into the P-type well region 662. The first conductive gate material 450a is in contact with the second conductive gate material 450b, and the first conductive gate material 451a is in contact with the second conductive gate material 451b. Other arrangements are within the scope of various embodiments. For example, in some embodiments, at least one of the gate dielectric layers 460a and 460b is interposed between and electrically isolates the first conductive gate material 450a and the second conductive gate material 450b. In some embodiments, at least one of the gate dielectric layers 460a and 460b includes one or more of $HfO_2$, $Ta_2O_5$ and $Al_2O_3$.

In some embodiments, the work function layer, the contact layer and the gate dielectric layer configure a gate stack structure. In some embodiments, the gate stack structure includes a $Si_3N_4$/metals/high-K dielectric structure. The gate spacer 470 is over opposite sides of the corresponding gate dielectric layers 460.

In some embodiments, the width of the fin line 310 under the first gate electrode 450 and in the first circuit 401 shown in FIG. 6A is different from that under the second gate electrode 451 in the second circuit 402 shown in FIG. 6B. The fin line 310 has a topmost end 312 and a lowest end 314, the fin line 320 has a topmost end 322 and a lowermost end 326, the fin line 330 has a topmost end 332 and a lowermost end 334, and the fin line 340 has a topmost end 342 and a lowermost end 344. The topmost ends 312, 322, 332, and 342 of the fin lines 310, 320, 330, and 340 face away from the substrate 464 and the lowermost ends 314, 324, 334, and 344 are adjacent to the substrate 464.

In some embodiments, a width T1 of the topmost end 312 in the first circuit 401 is larger than a width T5 of the topmost end 322 in the second circuit 402 in the Y-direction. A width T2 of the lowermost end 314 in the first circuit 401 is larger than a width T6 of the lowermost end 334 in the second circuit 402 in the Y-direction. A width T3 of the topmost end 322 in the first circuit 401 is larger than a width T7 of the topmost end 342 in the second circuit 402 in the Y-direction. A width T4 of the lowermost end 324 in the first circuit 401 is larger than a width T8 of the lowermost end 344 in the second circuit 402 in the Y-direction. In some embodiments, a ratio of T1/T5 is larger than 1.05, a ratio of T2/T6 is larger than 1.05, a ratio of T3/T7 is larger than 1.05, and/or a ratio of T4/T8 is larger than 1.05. In some embodiment, the first circuit has a first threshold voltage, the second circuit has a second threshold voltage, and the second threshold voltage is higher than the first threshold voltage about 15 mV to about 50 mV.

Due to the reduced of the thickness of the fin line, the circuit can be seemed as an extra low leakage device which may provide both a lower leakage and a lower capacitance for power saving application. In addition, the circuit with thinner fin line has a lower drain induced barrier lowering (DIBL) and a higher Vt compared to the circuit with thicker fin line.

In some embodiment, the first circuit 401 and the second circuit 402 substantially have the same gate pitch, gate critical dimension (CD), gate dielectric and work-function metal layers.

In some embodiments, as shown in FIGS. 4C and 4D, the source/drains 562, 564, and 566 disposed on the fins 310 and 320 and are arranged between adjacent gate electrodes 450 and 451 or between the adjacent gate electrode 450 and the dummy gate 452, 454, or 455 shown in FIG. 5. In FIGS. 6C and 6D and combined with FIG. 5, the semiconductor device 200 further includes source/drain contacts 550, 552, 554, and 556 arranged in the spaces between adjacent gate spacers 470 and 472. As shown in FIGS. 6C and 6D, the fins 310 and 320 each includes source/drains 562, 564, and 566 which are in contact with the corresponding source/drain contact 552, 554, and 556.

In some embodiments, the maximal width along the Y-direction of the source/drains in the first circuit 401 (may be referred to as a first device) shown in FIG. 6A is different from that in the second circuit 402 (may be referred to as a second device) shown in FIG. 6B. In some embodiments, a maximal width P1 of the source/drain 562 in the first circuit 401 is larger than a maximal width P3 of the source/drain 564 in the second circuit 402 along the Y-direction. A maximal width P2 of the source/drain 562 in the first circuit 401 is larger than a maximal width D4 of the source/drain 566 in the second circuit 402 along the Y-direction. In some embodiments, a ratio of P1/P3 is larger than 1.1, and/or a ratio of P2/P4 is larger than 1.15. Due to the smaller size of the source/drain, the source/drain can be more spaced apart from the gate electrode, and thus the circuit 402 may have a lower capacitance between the source/drain and the gate.

Referring to FIGS. 6E and 6F, the dummy gates 452, 454, and 455 include a dielectric material that is filled in the spaces between the corresponding spacers 472, 474, and 475 and is in contact with the corresponding fins as described with respect to FIG. 5. Other arrangements are within the scope of various embodiments. In the example configuration in FIGS. 6E and 6F, many aspects of the gate electrode 450, gate dielectric layer 460, and gate spacers 470 are the same as or similar to those of the gate electrode 250, gate dielectric layer 260, and gate spacers 270 shown in FIGS. 4E and 4F.

In the example configuration in FIG. 6E, the fin lines 310 and 330 terminate at corresponding edges of the common dummy gate 452. For example, an end 333 of the fin line 330 terminates at, and is in contact with, an edge 459 of the common dummy gate 452. An end 313 of the fin 310 terminates at, and is in contact with, an edge 457 of the common dummy gate 452. The edges 457 and 459 of the dummy gate 452 are at a lower portion of the dummy gate 452 which is located between, and electrically isolates, an upper portion of the fin 310 and an upper portion of the fin 330. The dummy gate 452 further has an upper portion arranged between the corresponding spacers 472. The upper and lower portions of the dummy gate 452 are continuous to each other. Similarly, the fin lines 330 and 350 terminate at corresponding edges of the other common dummy gate 452.

In the example configuration in FIG. 6F, the fins 320 and 340 terminate at corresponding edges of the common dummy gate 452. For example, an end 343 of the fin line 340 terminates at, and is in contact with, an edge 459 of the common dummy gate 452. An end 323 of the fin line 320 terminates at, and is in contact with, an edge 457 of the common dummy gate 452. The edges 457 and 459 of the dummy gate 452 are at a lower portion of the dummy gate 452 which is located between, and electrically isolates, an upper portion of the fin line 320 and an upper portion of the fin line 340.

Figure 7:
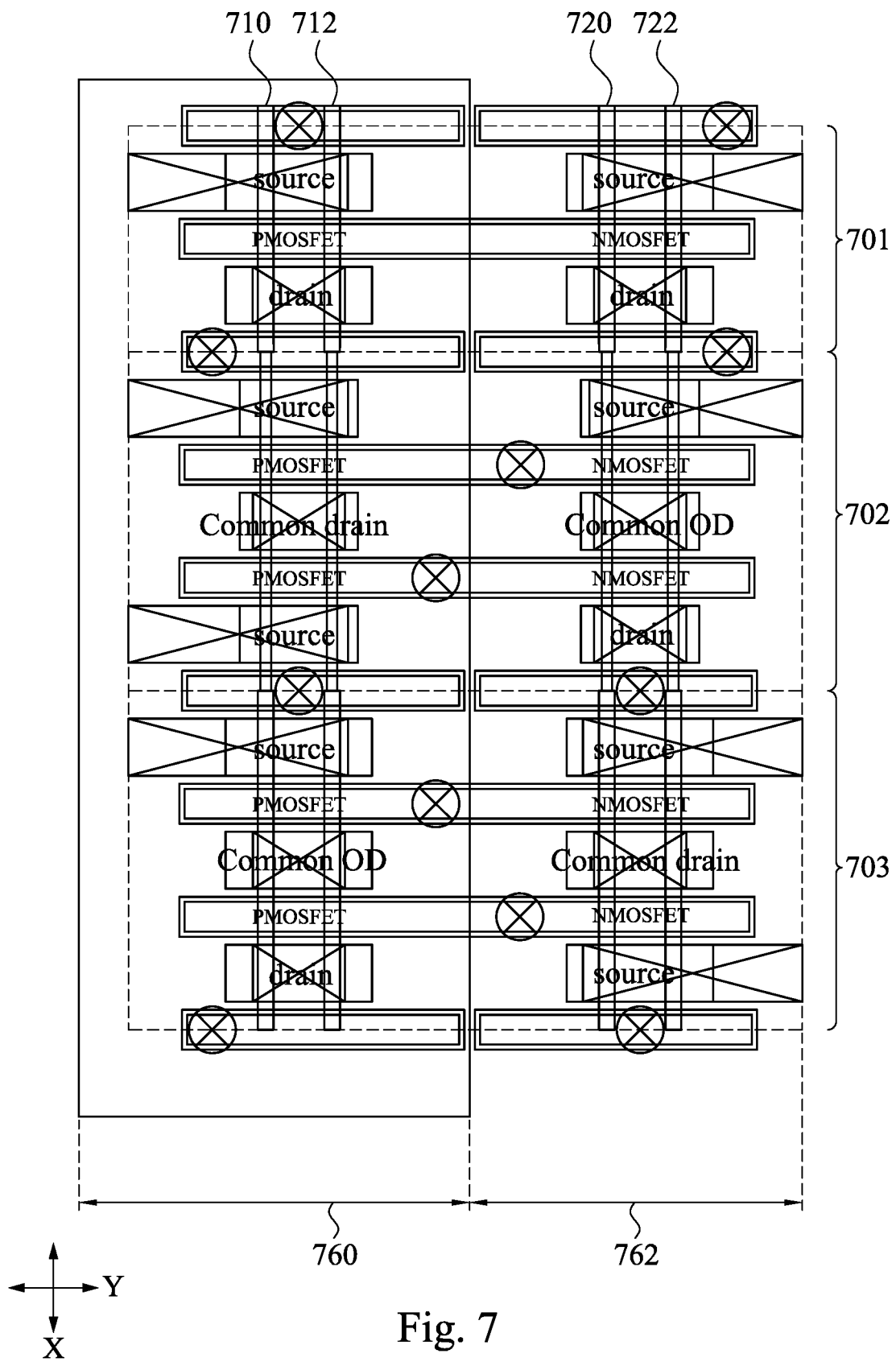
FIG. 7 is the top view of another layout according to some embodiments of the present disclosure.

FIG. 7 illustrates the top view of another layout according to some embodiments of the present disclosure. It is understood that the top view layout shown in FIG. 7 may correspond to one or more of the STD cells (or portions thereof) shown in FIG. 2. In some embodiments, a first circuit 701 corresponds to the first circuit 201 shown in FIG. 3B, the second circuit 702 corresponds to the second circuit 202 shown in FIG. 3B, and a third circuit 703 corresponds to the third circuit 203 shown in FIG. 3B, with a difference in that the fine line 210 is replaced by fine lines 710 and 712 in FIG. 7 and the fine line 220 is replaced by fine lines 720 and 722 in FIG. 7, but the numbers of the fin lines of the layout are not limited thereto. In some embodiments, any suitable number can be used in the layout.

In FIG. 7, at least two of the first circuit 701, the second circuit 702, and the third circuit 703 are different type of circuits form each other. In some embodiments, the first circuit 701 can be an inverter, the second circuit 702 can be a NAND, and the third circuit 703 can be a NOR. As examples, the logic gates shown in FIG. 7 includes an inverter gate, a NAND gate, and a NOR gate. The inverter gate, the NAND gate, and the NOR gate each include one or more N-type MOSFETs (NMOSFET) and one or more P-type MOSFETs (PMOSFETs).

In some embodiments, the elongated fin lines 710, 712, 720, and 722 extend in an elongated manner in the X-direction. The fin lines 710 and 712 are part of the PMOSFET, and the fin line 720 and 722 are part of the NMOSFET. The PMOSFET fin lines 710 and 712 are located over the N-type well region 760, whereas the NMOSFET fin lines 720 and 722 are located over the P-type well region 762. In some embodiments, the fin lines 710, 712, 720, and 722 are also referred to as oxide-definition (OD) regions. Example materials of the fin lines 710, 712, 720, and 722 include, but are not limited to, semiconductor materials doped with various types of p-dopants and/or n-dopants. In some embodiments, the fin lines 710, 712, 720, and 722 include dopants of the same type. In some embodiments, one of the fin lines 710, 712, 720, and 722 includes dopants of a type different from a type of dopants of another one of the fin lines 710, 712, 720, and 722. The fin lines 710, 712, 720, and 722 are isolated from each other by one or more isolation structures as described herein. The fin lines 710, 712, 720, and 722 are within corresponding well regions.

As discussed above with reference to FIG. 1A, the fin lines 710, 712, 720, and 722 each include a channel region as well as source/drain regions located next to (e.g., on opposite sides of) the channel region. In the present embodiments, the PMOSFET fin lines 710 and 712 are comprised of a silicon germanium (SiGe) material (for strain effect enhancement), but the NMOSFET fin lines 720 and 722 are comprised of a non-germanium-containing semiconductor material, for example Si. The fin lines 710, 712, 720, and 722 are each continuous, for example they each extend across three or more abutted cells (abutted in the X-direction).

In some embodiments, a width of at least one of the fin lines 710, 712, 720, and 722 are not uniform. In some embodiment, the fin line 710, 712, 720 and/or the fin line 722 has the width in a cell (or a first device) that is different from that in another cell (or a second device). In FIG. 7, the width of the fin line 710 and/or fin line 712 in the NAND is different from that in the inverter and/or different from that in the NOR. Alternatively, the width of the fin line 720 and/or fin line 722 in the NAND is different from that in the inverter and/or different from that in the NOR.

Figure 8:
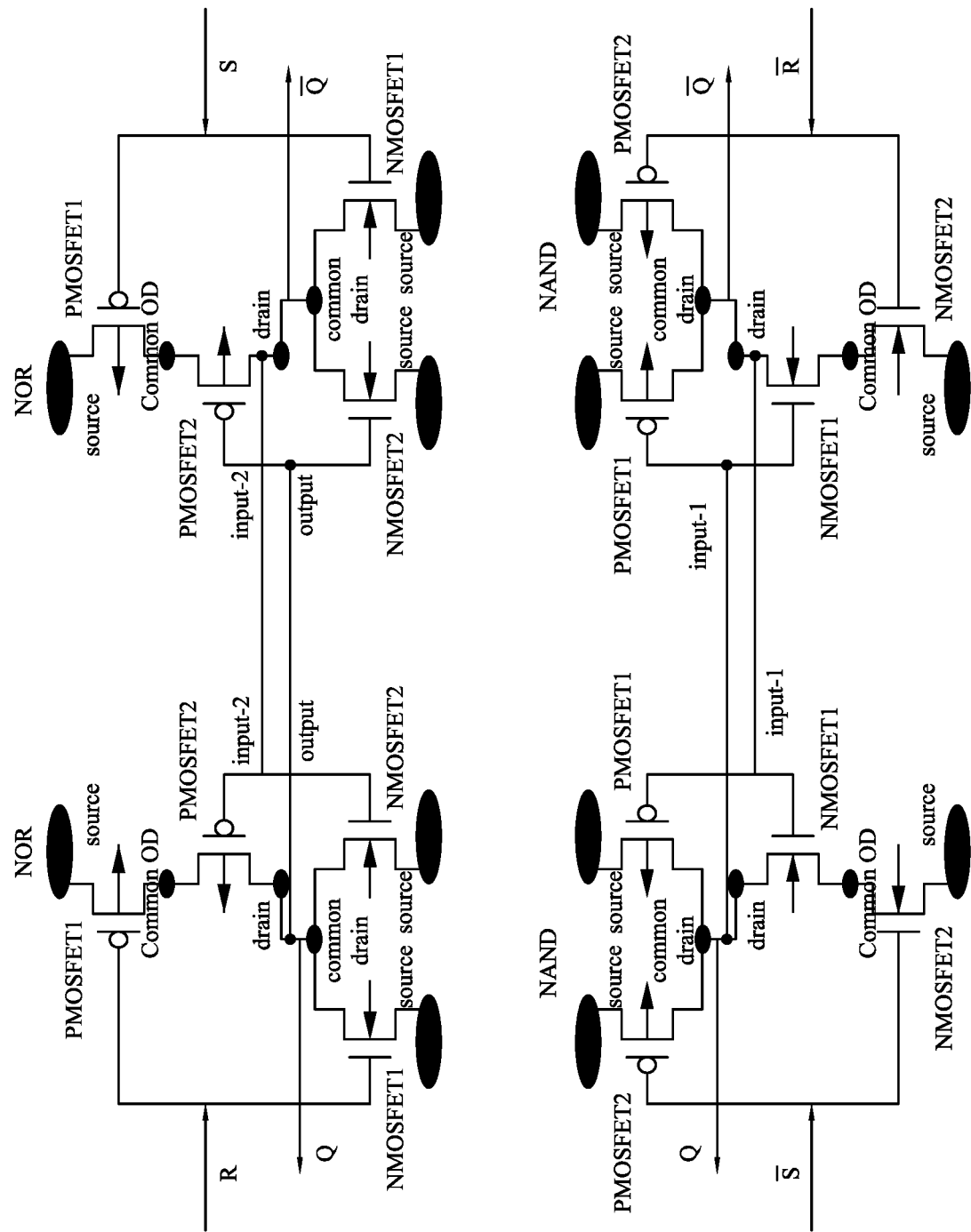
FIG. 8 is other circuit schematics of various logic gates according to some embodiments of the present disclosure.

FIG. 8 illustrates other circuit schematics of various logic gates according to some embodiments of the present disclosure. As examples, the logic gates shown in FIG. 8 includes Flip-Flop circuit schematics for NOR and NAND. It is understood that the top view layout of FIG. 8 may correspond to one or more of the STD cells (or portions thereof) shown in FIG. 2. As examples, the logic gates shown in FIG. 8 include a plurality of NAND gate and a plurality of NOR gate. The NAND gates and the NOR gates each include one or more N-type MOSFETs (NMOSFET) and one or more P-type MOSFETs (PMOSFETs). The particular type of logic gate is determined by coupling the gate, source, and drain of the NMOSFETs and PMOSFETs in a specific configuration as shown in FIG. 8. The input terminal and output terminal of each logic gate is also labeled in FIG. 8 as such. In the example configuration in FIG. 8, many aspects of the fin lines, the gate electrodes, gate dielectric layers, and gate spacers, etc. of the Flip-Flop circuit schematics are the same as or similar to those shown in FIGS. 3B to 7.

In some embodiments, a semiconductor device comprises a substrate, a first circuit and a second circuit on the substrate. The first circuit comprises a first semiconductor fin, a first gate electrode straddling the first semiconductor fin. The second circuit is different from the first circuit and comprises a second semiconductor fin and a second gate electrode straddling the second semiconductor fin. A width of the first semiconductor fin is different from a width of the second semiconductor fin.

In some embodiments, wherein an area of a top surface of the first semiconductor fin is different from an area of a top surface of the second semiconductor fin.

In some embodiments, a length of the first semiconductor fin is substantially equal to a length of the second semiconductor fin.

In some embodiments, the first circuit further comprises a first source/drain epitaxial structure on the first semiconductor fin, and a second source/drain epitaxial structure on the second semiconductor fin, wherein a width of the first epitaxial structure is different from a width of the second epitaxial structure along a lengthwise direction of the first gate electrode or the second gate electrode.

In some embodiments, the first gate electrode comprises a first work function layer, the second gate electrode comprises a second work function layer, and a material of the first work function layer is different from a material of the second work function layer.

In some embodiments, the substrate comprises a P-type well, and the first and second semiconductor fins are disposed on the P-type well.

In some embodiments, the substrate comprises a N-type well, and the first and second semiconductor fins are disposed on the N-type well.

In some embodiments, the first circuit is one of an inverter, an NAND, an NOR, and a Flip-Flop, and the second circuit is another one of the inverter, the NAND, the NOR, and the Flip-Flop.

In some embodiments, the first semiconductor fin is in contact with the second semiconductor fin.

In some embodiments, the semiconductor device further includes an isolation structure between the first and second semiconductor fins.

In some embodiments, the first and second circuits are isolated from each other.

In some embodiments, a semiconductor device includes a substrate, a first semiconductor fin on the substrate and extending along a first direction, and first and second gate electrodes across the first semiconductor fin and extending along a second direction intersecting the first direction. A first portion of the first semiconductor fin under the first gate electrode has a first width different from a second width of a second portion of the first semiconductor fin under the second gate electrode.

In some embodiments, the semiconductor device further comprises a first epitaxial structure on the first semiconductor fin and adjacent to the first gate electrode, and a second epitaxial structure on the first semiconductor fin and adjacent to the second gate electrode. A width of the first epitaxial structure is different from a width of the second epitaxial structure.

In some embodiments, the first gate electrode comprises a first work function layer, the second gate electrode comprises a second work function layer, and a material of the first work function layer is different from a material of the second work function layer.

In some embodiments, the semiconductor device further comprises a second semiconductor fin on the substrate and extending along the first direction, wherein the first and second gate electrodes are further across the second semiconductor fin.

In some embodiments, the substrate comprises first and second wells of opposite types, the first semiconductor fin is disposed on the first well, and the second semiconductor fin is disposed on the second well.

In some embodiments, a method for manufacturing a semiconductor device comprises modeling in a layout first and second fin lines having different widths, modeling in the layout first and second gate electrodes crossing the first and second fin lines, respectively, and forming first and second physical semiconductor fins and first and second physical gate electrodes in an integrated circuit using the first and second fin lines and the first and second gate electrodes as patterns, wherein the first and second physical gate electrodes are formed using different metals.

In some embodiments, the method further comprises epitaxial growing the first epitaxial structure on a portion of the first physical semiconductor fin, and epitaxial growing the second epitaxial structure on a portion of the second physical semiconductor fin. A width of the first epitaxial structure is different from a width of the second epitaxial structure.

In some embodiments, forming the first and second gate electrodes further comprises forming a first work function layer on the first physical semiconductor fin, and forming a second work function layer on the second physical semiconductor fin, wherein a material of the first work function layer is different from a material of the second work function layer.

In some embodiments, the method further comprises forming an isolating structure between the first and second semiconductor fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a substrate;
    a first circuit on the substrate and comprising:
        a first semiconductor fin; and
        a first gate electrode straddling the first semiconductor fin; and
    a second circuit, different from the first circuit, on the substrate and comprising:
        a second semiconductor fin;
        a second gate electrode straddling the second semiconductor fin, wherein a width of the first semiconductor fin is different from a width of the second semiconductor fin; and
    a third gate electrode straddling the first and second semiconductor fins.

2. The semiconductor device of claim 1, wherein an area of a top surface of the first semiconductor fin is different from an area of a top surface of the second semiconductor fin.

3. The semiconductor device of claim 1, wherein a length of the first semiconductor fin is substantially equal to a length of the second semiconductor fin.

4. The semiconductor device of claim 1, wherein the first circuit further comprises:

a first source/drain epitaxial structure on the first semiconductor fin; and a second source/drain epitaxial structure on the second semiconductor fin, wherein a width of the first source/drain epitaxial structure is different from a width of the second source/drain epitaxial structure along a lengthwise direction of the first gate electrode or the second gate electrode.

5. The semiconductor device of claim 1, wherein the first gate electrode comprises a first work function layer, the second gate electrode comprises a second work function layer, and a material of the first work function layer is different from a material of the second work function layer.

6. The semiconductor device of claim 1, wherein the substrate comprises a P-type well, and the first and second semiconductor fins are disposed on the P-type well.

7. The semiconductor device of claim 1, wherein the substrate comprises an N-type well, and the first and second semiconductor fins are disposed on the N-type well.

8. The semiconductor device of claim 1, wherein the first circuit is one of an inverter, an NAND, an NOR, and a Flip-Flop, and the second circuit is another one of the inverter, the NAND, the NOR, and the Flip-Flop.

9. The semiconductor device of claim 1, wherein the first semiconductor fin is in contact with the second semiconductor fin.

10. The semiconductor device of claim 1, wherein the first and second circuits are isolated from each other.

11. A semiconductor device, comprising:
a substrate;
a first semiconductor fin on the substrate and extending along a first direction; and
first and second gate electrodes across the first semiconductor fin and extending along a second direction intersecting the first direction, wherein a first portion of the first semiconductor fin under the first gate electrode has a first width different from a second width of a second portion of the first semiconductor fin under the second gate electrode.

12. The semiconductor device of claim 11, further comprising:
a first epitaxial structure on the first semiconductor fin and adjacent to the first gate electrode; and
a second epitaxial structure on the first semiconductor fin and adjacent to the second gate electrode, wherein a width of the first epitaxial structure is different from a width of the second epitaxial structure.

13. The semiconductor device of claim 11, wherein the first gate electrode comprises a first work function layer, the second gate electrode comprises a second work function layer, and a material of the first work function layer is different from a material of the second work function layer.

14. The semiconductor device of claim 11, further comprising a second semiconductor fin on the substrate and extending along the first direction, wherein the first and second gate electrodes are further across the second semiconductor fin.

15. The semiconductor device of claim 14, wherein the substrate comprises first and second wells of opposite types, the first semiconductor fin is disposed on the first well, and the second semiconductor fin is disposed on the second well.

16. The semiconductor device of claim 1, wherein a lengthwise direction of the first semiconductor fin is substantially the same as a lengthwise direction of the second semiconductor fin.

17. A semiconductor device, comprising:
a substrate having a first type well region;
a first transistor on the first type well region and comprising a first semiconductor fin;
a second transistor on the first type well region and comprising a second semiconductor fin that is in direct contact with the first semiconductor fin, wherein a first width of the first semiconductor fin is different from a second width of the second semiconductor fin; and
a gate structure overlapping a longitudinal end of the first semiconductor fin and a longitudinal end of the second semiconductor fin when viewed from above.

18. The semiconductor device of claim 17, wherein the second semiconductor fin shrinks from the first semiconductor fin.

19. The semiconductor device of claim 17, wherein the first and second semiconductor fins are aligned with each other along a lengthwise direction of the first semiconductor fin.

20. The semiconductor device of claim 17, wherein the substrate further has a second type well region adjacent to the first type well region, and a distance between the first semiconductor fin and the second type well region is different from a distance between the second semiconductor fin and the second type well region.

* * * * *